US011251385B2

(12) United States Patent
Ellingson et al.

(10) Patent No.: US 11,251,385 B2
(45) Date of Patent: Feb. 15, 2022

(54) INEXPENSIVE, EARTH-ABUNDANT, TUNABLE HOLE TRANSPORT MATERIAL FOR CDTE SOLAR CELLS

(71) Applicant: The University of Toledo, Toledo, OH (US)

(72) Inventors: Randall J. Ellingson, Toledo, OH (US); Khagendra P. Bhandari, Toledo, OH (US); Michael Heben, Toledo, OH (US); Suneth Watthage, Toledo, OH (US); Zhaoning Song, Toledo, OH (US)

(73) Assignee: The University of Toledo, Toledo, OH (US)

( * ) Notice: Subject to any disclaimer, the term of this patent is extended or adjusted under 35 U.S.C. 154(b) by 14 days.

(21) Appl. No.: 15/880,807

(22) Filed: Jan. 26, 2018

(65) Prior Publication Data
US 2018/0219166 A1    Aug. 2, 2018

Related U.S. Application Data

(60) Provisional application No. 62/451,399, filed on Jan. 27, 2017.

(51) Int. Cl.
| | | |
|---|---|---|
| *H01L 51/42* | (2006.01) | |
| *H01L 51/00* | (2006.01) | |
| *H01L 27/30* | (2006.01) | |
| H01L 31/0256 | (2006.01) | |
| H01L 51/44 | (2006.01) | |

(52) U.S. Cl.
CPC ........ *H01L 51/4213* (2013.01); *H01L 27/302* (2013.01); *H01L 51/424* (2013.01); *H01L 51/0077* (2013.01); *H01L 51/441* (2013.01); *H01L 2031/0344* (2013.01); *H01L 2251/301* (2013.01); *Y02E 10/549* (2013.01)

(58) Field of Classification Search
None
See application file for complete search history.

(56) References Cited

U.S. PATENT DOCUMENTS

| | | | |
|---|---|---|---|
| 4,369,099 A | 1/1983 | Kohl et al. | |
| 4,675,468 A * | 6/1987 | Basol | ............ H01L 31/073 136/256 |
| 6,252,158 B1 * | 6/2001 | Higashikawa | ...... H01L 31/0725 136/258 |

(Continued)

FOREIGN PATENT DOCUMENTS

| | | | | |
|---|---|---|---|---|
| JP | 2007031178 A | * | 2/2007 | ............ C01B 19/00 |
| WO | 2014097299 A1 | | 6/2014 | |

OTHER PUBLICATIONS

Tiwari, A.N. et al., "CdTe Solar Cell in a Novel Configuration", Progress in Photovoltaics: Research and Applications, 2004; 12:33-38 (Year: 2004).*

(Continued)

*Primary Examiner* — Tamir Ayad
(74) *Attorney, Agent, or Firm* — MacMillan, Sobanski & Todd, LLC

(57) ABSTRACT

Hole transport layers, electron transport layers, layer stacks, and optoelectronic devices involving perovskite materials and materials used as precursors, and methods of making the same, are described.

4 Claims, 45 Drawing Sheets
(25 of 45 Drawing Sheet(s) Filed in Color)

(56) References Cited

U.S. PATENT DOCUMENTS

| | | | | |
|---|---|---|---|---|
| 2012/0104365 A1* | 5/2012 | Ratier | ............... | H01L 51/442 |
| | | | | 257/40 |
| 2014/0284750 A1* | 9/2014 | Yu | ............... | H01L 31/1864 |
| | | | | 257/436 |
| 2015/0228415 A1* | 8/2015 | Seok | ............... | H01G 9/2027 |
| | | | | 136/256 |
| 2015/0249172 A1* | 9/2015 | Irwin | ............... | H01L 31/032 |
| | | | | 136/261 |
| 2015/0340632 A1* | 11/2015 | Etgar | ............... | H01L 51/4226 |
| | | | | 136/255 |
| 2016/0079552 A1* | 3/2016 | Su | ............... | H01L 51/0032 |
| | | | | 136/260 |
| 2016/0226011 A1* | 8/2016 | Nazeeruddin | ....... | H01L 51/4213 |
| 2017/0236651 A1 | 8/2017 | Bakr et al. | | |
| 2018/0351123 A1* | 12/2018 | Saliba | ............... | H01L 51/4226 |

OTHER PUBLICATIONS

English machine translation of JP 2007031178A (Year: 2007).*
Rühle, Sven, "The detailed balance limit of perovskite/silicon and perovskite/CdTe tandem solar cells", Phys. Status Solidi A 214, No. 5, 1600955 (2017), pp. 1-10. (Year: 2017).*
"Fabrication of an ITO back contact", Energy Environ. Sci., 2014, 7, 1377, pp. 1-10.

* cited by examiner

| Back Contacts | $V_{OC}$ (V) | $J_{SC}$ (mA/cm$^2$) | FF (%) | η (%) |
|---|---|---|---|---|
| Cu/Au | 0.812 | 19.8 | 75.6 | 12.1 |
| Cu/PK/Au: F | 0.842 | 20.0 | 74.1 | 12.5 |
| Cu/PK/Au: R | 0.841 | 19.9 | 73.8 | 12.4 |

FIG. 6C – Table 1

| Back Contacts | $V_{OC}$ (V) | $J_{SC}$ (mA/cm$^2$) | FF (%) | PCE (%) | $R_S$ (Ω cm$^2$) | $R_{Sh}$ (Ω cm$^2$) |
|---|---|---|---|---|---|---|
| Cu/Au | 0.832 | 19.9 | 75.7 | 12.5 | 2.5 | 3210 |
| Cu/0.1M/Au | 0.838 | 19.6 | 77.2 | 12.7 | 3.2 | 2448 |
| Cu/0.3M/Au | 0.836 | 20.2 | 77.5 | 13.1 | 3.2 | 3299 |
| Cu/0.5M/Au | 0.839 | 19.3 | 77.8 | 12.6 | 3.4 | 3105 |
| Cu/0.7M/Au | 0.841 | 20.0 | 77.1 | 13.0 | 3.4 | 3124 |

FIG. 7B – Table 2

| Sample | $V_{oc}$ (mV) | $J_{sc}$ (mA/cm$^2$) | FF (%) | PCE (%) |
|---|---|---|---|---|
| Control | | | | |
| Average | 814 ± 3 | 21.0 ± 0.5 | 73.9 ± 0.6 | 12.6 ± 0.3 |
| Champion | 813 | 22.1 | 73.3 | 13.2 |
| 20 s | | | | |
| Average | 822 ± 4 | 20.9 ± 0.3 | 76.2 ± 0.5 | 13.1 ± 0.2 |
| Champion | 819 | 21.5 | 75.8 | 13.4 |
| 40 s | | | | |
| Average | 823 ± 4 | 20.8 ± 0.4 | 76.3 ± 0.7 | 13.1 ± 0.2 |
| Champion | 818 | 21.9 | 76.1 | 13.7 |
| 60 s | | | | |
| Average | 817 ± 9 | 21.0 ± 0.4 | 73.0 ± 4.3 | 12.5 ± 0.1 |
| Champion | 821 | 21.7 | 75.8 | 13.5 |

FIG. 10 – Table 3

| Samples | Voc (mV) | Jsc (mA/cm^2) | FF (%) | Eff. (%) | Rs (Ω*cm^2) | Rs (Ω*cm^2) |
|---|---|---|---|---|---|---|
| Cu/Au | 814±6 | 20.8±0.2 | 74.7±0.6 | 12.6±0.3 | 3.5±0.5 | 2574±557 |
| FAI-5-Cu/Au* | 818±3 | 19.6±0.2 | 76.5±0.4 | 12.3±0.1 | 2.7±0.9 | 3661±526 |
| FAI-10-Cu/Au | 787±3 | 20.3±0.2 | 72.2±1.1 | 11.5±0.3 | 3.3±0.3 | 2690±1267 |
| FAI-15-Cu/Au | 803±7 | 20.5±0.2 | 73.6±1.8 | 12.2±0.4 | 2.6±0.2 | 2395±396 |

FIG. 13B – Table 4

| Parameters | CB/AB | Br 10% | Br 30% | Br 50% | Br 70% | Br 90% |
|---|---|---|---|---|---|---|
| $V_{oc}$ (V) | 0.820 | 0.829 | 0.830 | 0.833 | 0.839 | 0.846 |
| $J_{sc}$ (mA·cm$^{-2}$) | 20.3 | 20.9 | 20.7 | 20.8 | 20.6 | 21.5 |
| FF (%) | 75.1 | 77.2 | 78.8 | 79.2 | 79.0 | 80.7 |
| PCE (%) | 12.5 | 13.3 | 13.5 | 13.7 | 13.7 | 14.7 |
| $R_s$ (Ω·cm$^2$) | 2.5 | 3.4 | 3.1 | 3.0 | 3.0 | 2.9 |
| $R_{sh}$ (Ω·cm$^2$) | 2018 | 3562 | 4034 | 4179 | 3268 | 5631 |

FIG. 18 – Table 5

| Current-Voltage performance parameters | | | | | | |
|---|---|---|---|---|---|---|
| Back Contacts | $V_{OC}$ (V) | $J_{SC}$ (mA/cm$^2$) | FF (%) | PCE (%) | $R_S$ ($\Omega$ cm$^2$) | $R_{Sh}$ ($\Omega$ cm$^2$) |
| Cu/Au | 0.818 | 20.3 | 75.0 | 12.6 | 3.1 | 3259 |
| 0.3µm MAPb(I$_{0.9}$Br$_{0.1}$)$_3$ | 0.811 | 20.5 | 75.7 | 12.6 | 3.9 | 2959 |
| 0.8µm MAPb(I$_{0.9}$Br$_{0.1}$)$_3$ | 0.889 | 20.7 | 75.1 | 13.8 | 3.3 | 3256 |
| 1.2µm MAPb(I$_{0.9}$Br$_{0.1}$)$_3$ | 0.851 | 20.1 | 68.6 | 11.7 | 6.9 | 2020 |

FIG. 21B – Table 6

| Device | Voc (mV) | Jsc (mA/cm$^2$) | FF (%) | Eff (%) | $\phi_b$ (eV) |
|---|---|---|---|---|---|
| CdTe:Cu/Au | 811 | 21.3 | 75.6 | 13.0 | 0.344 ± 0.010 |
| CdTe:Cu/Te/Au | 831 | 21.8 | 77.9 | 14.1 | 0.198 ± 0.007 |
| CdTe:Cu/ITO | 807 | 21.2 | 64.4 | 11.0 | 0.246 ± 0.005 |
| CdTe:Cu/Te/ITO | 823 | 21.4 | 69.3 | 12.2 | 0.130 ± 0.001 |

FIG. 28B – Table 7

INEXPENSIVE, EARTH-ABUNDANT, TUNABLE HOLE TRANSPORT MATERIAL FOR CDTE SOLAR CELLS

RELATED APPLICATIONS

This application claims priority to U.S. Provisional Application No. 62/451,399, filed under 35 U.S.C. § 111(b) on Jan. 27, 2017, the entire disclosure of which is expressly incorporated herein by reference for all purposes.

STATEMENT REGARDING SPONSORED RESEARCH

This invention was made with government support under Grant Number CHE-1230246 awarded by the National Science Foundation and also under Grant Number FA9453-11-C-0253 awarded by the Air Force Research Laboratory. The government has certain rights in this invention.

BACKGROUND OF THE INVENTION

Photovoltaic cells are optoelectronic devices that convert light energy into electrical energy. Typical photovoltaic cells include a substrate layer for mounting the cell and two ohmic contacts or electrode layers for passing current to an external electrical circuit. The cell also includes an active semiconductor junction, usually comprising two or three semiconductor layers in series. The two layer type of semiconductor cell is composed of an n-type layer and a p-type layer, and the three layer type includes an intrinsic (i-type) layer positioned between the n-type layer and the p-type layer for absorption of light radiation. The photovoltaic cells operate by having readily excitable electrons that can be energized by solar energy to higher energy levels, thereby creating positively charged holes and negatively charged electrons at the interface of various semiconductor layers. The creation of these positive and negative charge carriers applies a net voltage across the two electrode layers in the photovoltaic cell, establishing a current of electricity.

Photovoltaic cells have been produced using a variety of materials for the various functional layers of the cell. In particular, semiconductor layers of alloys using cadmium, tellurium, sulfur, indium, gallium, and even iron are known in the art. Thin film solar cells use a very thin absorbing layer (such as CdTe, CIGS, or a:Si) compared to crystalline silicon solar cells. CdTe represents the most eco-efficient photovoltaic technology, with low green house gas emission and the smallest energy payback time. CdTe solar cell technology is one of the well-established approaches for high efficiency, low cost, and stable thin films photovoltaics (PV). With a direct band gap of 1.45 eV, CdTe is an ideal absorber material for single junction solar cells, and a power conversion efficiency (PCE) of 22.1% has been achieved in small area devices.

The ohmic contacts of photovoltaic cells are often configured as front and back contacts. The front electrical contact is a transparent or semi-transparent layer that is electrically conductive and permits light energy to pass through to the semiconductor layers below. The back contact is also electrically conductive but is not necessarily a transparent layer. Back contacts are known to include materials containing copper, gold, zinc, aluminum, and graphite, for example. These materials, however, may be adversely reactive with adjacent semiconductor layers, may pose manufacturing or durability concerns, or may be expensive. Furthermore, as the work function of commonly available metal is smaller than the work function of CdTe, a Schottky junction (rectifying barrier) is generally formed at the CdTe/metal interface. The diode of opposite nature formed at the interface has a tendency to block the photo-generated holes from reaching the back contact metal, resulting severe performance degradation in the devices. An increase in carrier density of the CdTe film is generally necessary to minimize rectifying behavior. Therefore, there is a need for a suitable hole transport layer in CdTe solar cells, to minimize or eliminate the back barrier effects.

SUMMARY OF THE INVENTION

In a first aspect, provided herein is an optoelectronic device comprising a front electrode, at least one semiconductor layer on the front electrode, a back electrode on the semiconductor layer, and a hole transport layer disposed between the semiconductor layer and the back electrode, where the hole transport layer comprises a perovskite. In certain embodiments, the perovskite has the general formula $ABX_3$, where A is an alkaline earth element, a rare earth element, or an organic compound; B is a transition metal, a Group 13 metal, a Group 14 metal, or a Group 15 metal; and X is a halogen. In particular embodiments, the halogen is selected from the group consisting of iodine, bromine, and chlorine. In particular embodiments, the perovskite has the formula $CH_3NH_3PbX_3$, and X is selected from the group consisting of I, Br, Cl, and F. In particular embodiments, the perovskite is $CH_3NH_3PbI_3$.

In certain embodiments, the perovskite has the general formula $ABZ_yX_{3-y}$, where A is an alkaline earth element, a rare earth element, or an organic compound; B is a transition metal, a Group 13 metal, a Group 14 metal, or a Group 15 metal; X and Z are each different halogens, and y ranges from 0 to 1. In particular embodiments, the perovskite comprises $MAPbBr_yI_{3-y}$, wherein y ranges from 0 to 1.

In certain embodiments, the perovskite comprises $MAPb(Z_{1-x}Y_x)_3$, wherein x ranges from 0 to 1, Z is a first halogen, and Y is a second halogen. In particular embodiments, Z is iodine and Y is bromine. In particular embodiments, x is selected from the group consisting of 0.1, 0.3, 0.5, 0.7, and 0.9.

In certain embodiments, the optoelectronic device is a photovoltaic device. In particular embodiments, the semiconductor layer includes one of CdTe, copper indium zinc gallium di-selenide (CIGS), copper zinc tin sulfide (CZTS), copper zinc tin sulfur selenium alloy (CZTSSe), copper antimony sulfide, or tin sulfide. In particular embodiments, the optoelectronic device further includes a second semiconductor layer that forms a photovoltaic heterojunction with the at least one semiconductor layer. In particular embodiments, the at least one semiconductor layer comprises CdTe, and the second semiconductor layer comprises CdS. In certain embodiments, the back electrode comprises Au, Cu, Sb, Hg, Bi-telluride, or graphene.

Also provided is a photovoltaic device comprising a support, a transparent conductor (TC) layer on the support, a photovoltaic heterojunction on the TC layer, where the photovoltaic heterojunction comprises a CdTe layer, a hole transport layer comprising a perovskite material on the CdTe layer, and a back contact on the hole transport layer. In certain embodiments, the perovskite has the general formula $ABX_3$, where A is an alkaline earth element, a rare earth element, or an organic compound; B is a transition metal, a Group 13 metal, a Group 14 metal, or a Group 15 metal; and X is a halogen. In certain embodiments, the perovskite has the formula $CH_3NH_3PbX_3$, and X is selected from the group consisting of I, Br, and Cl. In particular embodiments, the perovskite is $CH_3NH_3PbI_3$. In certain embodiments, the perovskite has the general formula $ABZ_yX_{3-y}$, where A is an alkaline earth element, a rare earth element, or an organic compound; B is a transition metal, a Group 13 metal, a Group 14 metal, or a Group 15 metal; X and Z are each different halogens; and y ranges from 0 to 1. In particular embodiments, the perovskite comprises $MAPbBr_yI_{3-y}$, wherein y ranges from 0 to 1.

Also provided is a photovoltaic device comprising a support, a front electrode on the support, an electron transport layer on the front electrode, where the electron transport layer comprises CdTe, an absorber layer on the electron transport layer, where the absorber layer comprises a perovskite, and a back contact on the absorber layer. In certain embodiments, the perovskite has the formula $CH_3NH_3PbX_3$, and X is selected from the group consisting of I, Br, and Cl. In particular embodiments, the perovskite is $CH_3NH_3PbI_3$. In certain embodiments, the perovskite has the general formula $ABZ_yX_{3-y}$, where A is an alkaline earth element, a rare earth element, or an organic compound; B is a transition metal, a Group 13 metal, a Group 14 metal, or a Group 15 metal; X and Z are each different halogens; and y ranges from 0 to 1. In particular embodiments, the perovskite comprises $MAPbBr_yI_{3-y}$, wherein y ranges from 0 to 1.

Also provided is a layer stack comprising a support, a front contact layer on the support, a photovoltaic heterojunction on the front contact layer, where the photovoltaic heterojunction comprises a CdTe layer, and a layer comprising a cadmium perovskite directly on the CdTe layer. In certain embodiments, the cadmium perovskite comprises $MA_2CdX_4$ perovskite, wherein MA is methylammonium and X is selected from the group consisting of I, Br, Cl, and F.

Also provided is a method of forming a diode, the method comprising contacting a semiconductor layer comprising CdTe with an organo halide solution for a period of time to create a Te-rich region of the semiconductor layer or a layer of Te on the semiconductor layer, and forming an electrical contact on the Te-rich region or on the layer of Te to produce a diode. In certain embodiments, the organo halide solution comprises an organic cation capable of forming a soluble structure with cadmium in solution, and a halide anion selected from the group consisting of fluoride, chloride, bromide, and iodide. In certain embodiments, the organo halide solution comprises methylammonium iodide (MAI), methylammonium chloride (MACl), methylammonium bromide (MABr), or methylammonium fluoride (MAF). In certain embodiments, the organo halide solution comprises formamidinium iodide (FAI), formamidinium chloride (FACl), formamidinium bromide (FABr), or formamidinium fluoride (FAF). In certain embodiments, the organo halide solution comprises a solvent selected from the group consisting of anhydrous dimethylformamide (DMF), dimethyl sulfoxide (DMSO), anhydrous isopropanol (IPA), and mixtures thereof. In certain embodiments, the organo halide solution comprises an organo halide at a concentration ranging from about 10 mM to about 1 M. In certain embodiments, the organo halide solution comprises an organo halide at a concentration ranging from about 125 mM to about 500 mM. In certain embodiments, the period of time ranges from about 20 seconds to about 60 seconds. In certain embodiments, the organo halide solution forms an organo halide thin film layer on the CdTe, and the method further comprises rinsing the semiconductor layer with a solvent to remove the organo halide solution. In particular embodiments, the organo halide thin film layer comprises a methylammonium iodide (MAI) thin film or a formamidinium iodide (FAI) thin film. In particular embodiments, the solvent comprises anhydrous isopropanol.

Also provided is a method of making a photovoltaic device, the method comprising treating a semiconductor layer comprising CdTe by contacting the semiconductor layer with an organo halide solution for a period of time to form a Te-rich region of the semiconductor layer or a layer of Te on the semiconductor layer, where the semiconductor layer is on a layer stack comprising a front contact, forming a hole transport layer on the semiconductor layer or the layer of Te, where the hole transport layer comprises a perovskite, and forming a back contact on the hole transport layer. In certain embodiments, the period of time ranges from about 20 seconds to about 60 seconds. In certain embodiments, the halide perovskite precursor solution comprises methylammonium iodide (MAI) or formamidinium iodide (FAI).

Also provided is a method of making a photovoltaic device, the method comprising depositing a CdTe layer on a layer stack comprising a front contact, depositing an absorber layer on the CdTe layer, where the absorber layer comprises a perovskite, and forming a back contact on the absorber layer to make a photovoltaic device. In certain embodiments, the perovskite has the general formula $ABX_3$, where A is an alkaline earth element, a rare earth element, or an organic compound; B is a transition metal, a Group 13 metal, a Group 14 metal, or a Group 15 metal; and X is a halogen. In certain embodiments, the perovskite has the formula $CH_3NH_3PbX_3$, and X is selected from the group consisting of I, Br, Cl, and F. In particular embodiments, the perovskite is $CH_3NH_3PbI_3$. In certain embodiments, the perovskite has the general formula $ABZ_yX_{3-y}$, where A is an alkaline earth element, a rare earth element, or an organic compound; B is a transition metal, a Group 13 metal, a Group 14 metal, or a Group 15 metal; X and Z are each different halogens; and y ranges from 0 to 1. In particular embodiments, the perovskite comprises $MAPbBr_yI_{3-y}$, where y ranges from 0 to 1.

Further provided is a photovoltaic device comprising a first photovoltaic device comprising a first photovoltaic sub-cell disposed on a second photovoltaic sub-cell, wherein the first photovoltaic sub-cell includes a photovoltaic heterojunction comprising a CdTe layer, and a hole transport layer comprising a perovskite on the CdTe layer; and the second photovoltaic sub-cell includes a photovoltaic heterojunction comprising a CdXTe layer, wherein X is Zn, Mg, or another metal.

Further provided is a photovoltaic device comprising a first photovoltaic device comprising a first photovoltaic sub-cell disposed on a second photovoltaic sub-cell, wherein the first photovoltaic sub-cell includes an electron transport layer comprising CdTe, and an absorber comprising a perovskite; and the second photovoltaic sub-cell includes a photovoltaic heterojunction comprising a CdXTe layer, wherein X is Zn, Mg, or another metal.

BRIEF DESCRIPTION OF THE DRAWINGS

The patent or application file contains one or more drawings executed in color and/or one or more photographs. Copies of this patent or patent application publication with color drawing(s) and/or photograph(s) will be provided by the U.S. Patent and Trademark Office upon request and payment of the necessary fees.

FIGS. 6A-6C: Graph of J-V characteristics of CdTe solar cells with and without MAPbI$_3$, where bias was applied in two directions (FIG. 6A), graph showing EQE measurement of the same two devices (FIG. 6B), and Table 1, displaying $V_{OC}$, $J_{SC}$, FF, and η values for example devices with and without a perovskite hole transport layer (FIG. 6C).

FIGS. 7A-7B: Graph of J-V characteristics when scanning from forward to reverse bias voltage for a CdS/CdTe/Cu/perovskite/Au device, and with bromine incorporated at varying concentrations from 0.1 M to 0.7M (FIG. 7A), and Table 2, displaying the performance parameters of CdTe solar cells when using Cu/Au and Cu/MAPbI$_3$/Au back contacts with Br concentrations from 0.1 to 0.7M (FIG. 7B).

FIGS. 9C-9D show the surface morphology of an organo halide treated sample with a 20 s treatment time in low (FIG. 9C) and high (FIG. 9D) magnifications.

FIG. 10: Table 3, displaying solar cell performance metrics for devices made with treated samples (at 20 s, 40 s, and 60 s treatment times) and an untreated (control) sample.

FIGS. 13A-13B: Graph showing the J-V characteristics (FIG. 13A), and Table 4, showing the performance characteristics (FIG. 13B), of FAI-treated and annealed CdTe samples.

FIG. 18: Table 5, showing performance characteristics as a function of Br content in photovoltaic devices having a MAPb(I$_{1-x}$Br$_x$)$_3$ hole transport layer, where x varies from 0.1 to 0.9.

FIGS. 21A-21B: Graph showing J-V characteristics (FIG. 21A), and Table 6, displaying performance characteristics (FIG. 21B), for Cu/Au and Cu/MAPb(I$_{0.9}$Br$_{0.1}$)$_3$/Au back contact devices.

FIG. 27A shows extracting Cd from the CdTe surface via formation of MA$_2$CdI$_4$. FIG. 27B shows removing MA$_2$CdI$_4$ and excess MAI by rinsing with a solvent of IPA to dissolve the MAI and MA$_2$CdI$_4$.

DETAILED DESCRIPTION

Definitions

Figure 1:
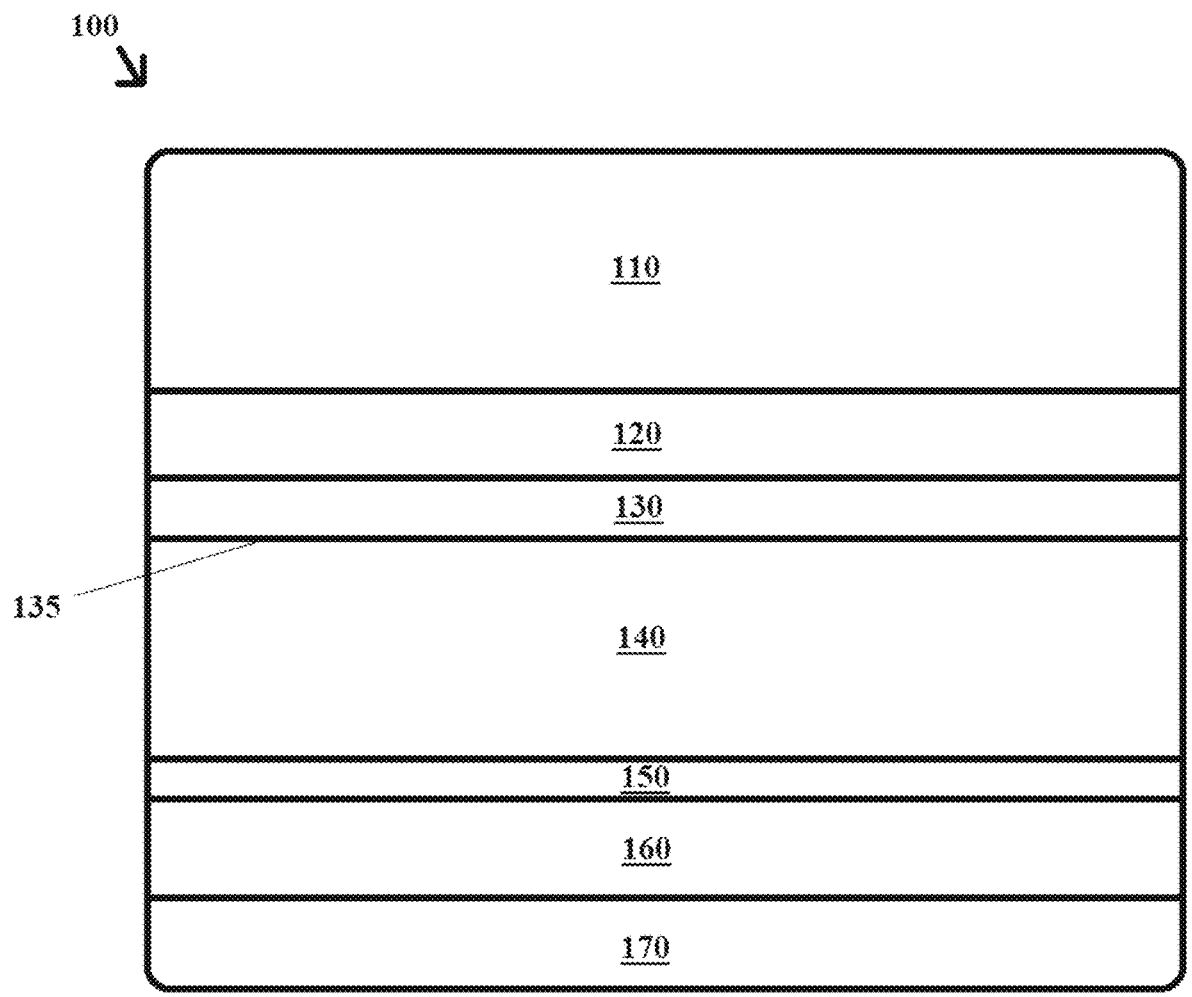
FIG. 1: Schematic of a non-limiting example CdTe-based photovoltaic device that includes a perovskite hole transport layer.

For convenience, various terms are explained or clarified before further description of the present disclosure.

When a layer is described herein as being disposed or positioned "on" another layer or substrate, it is to be understood that the layers can either be directly contacting each other or have one or more layer or feature between the layers. The term "on" describes the relative position of the layers to each other and does not necessarily mean "on top of" since the relative position above or below depends upon the orientation of the device to the viewer. Moreover, the use of terms such as "top," "bottom," "above," "below," "back," "rear," "front," and variations of these terms is made for convenience, and does not require any particular orientation of the components unless otherwise stated. Likewise, a layer that is "disposed on" or "on" a different layer does not necessarily imply that the two layers are in direct contact with one another and may allow for the presence of intervening layers. In contrast, the term "adjacent" is used to describe two layers that are in direct physical contact. Furthermore, the terms "on top of," "formed over," "deposited over," and "provided over" mean formed, deposited, provided, or located on a surface but not necessarily in direct contact with the surface. For example, a layer "formed over" a substrate does not preclude the presence of one or more other layers or films of the same or different composition located between the formed layer and the substrate.

The term "transparent" as used herein refers to material that allows an average transmission of at least 70% of incident electromagnetic radiation having a wavelength of from about 300 nm to about 900 nm.

As used herein, the term "ohmic," in the context of back contact electrical performance, is understood to include both ohmic and near ohmic contacts. As generally understood, ohmic contacts typically have no electronic barrier to the flow of holes at the back contact. Near ohmic contacts may exhibit some retained barrier to hole flow.

The terms "photovoltaic cell" and "photovoltaic device" are used interchangeable herein for convenience and ease of description.

General Description

The work function of CdTe is higher than the work function of metals that are commonly used to make back contacts in CdTe-based photovoltaic devices. The carrier density of a CdTe semiconductor is also typically low (~$10^{15}$ cm$^{-3}$). Thus, for a CdS/CdTe device, a suitable hole transport layer is desirable because the lower work function metal back contact generates a Schottky junction at the back contact interface, blocking the efficient transport of photogenerated holes to the back contact metals. An increase in the carrier density in the CdTe film is important to minimize the rectifying behavior. Elemental Cu is commonly used as a back contact to increase the carrier density and increase the device performance. However, copper alone is not sufficient to form an efficient metal back contact.

In accordance with the present disclosure, a simple perovskite material performs well as a hole transport layer in a back contact structure, such as in a CdTe-based photovoltaic device, providing an alternative to copper-doped ZnTe, which utilizes an inherently expensive process due to the relative rarity of tellurium. Also, perovskites are intrinsically tunable in their properties, unlike ZnTe. Perovskites offer a wide range of tunable properties based on the varying of cations and anions, and the incorporation of dopants. The use of perovskites in a hole transport layer between a CdTe absorber and a back contact metal improves device performance by improving the $V_{OC}$ and FF of the devices, and reduces the cost of materials and processing. Without wishing to be bound by theory, it is believed that the bandgap offset between the CdTe absorber and the perovskite is important, as it can result in a low barrier for holes, especially when tuned, but a significant energy barrier for electrons. Though photovoltaic devices, and more particularly, CdTe-based photovoltaic devices, are described for exemplary purposes, it is understood that the present disclosure is equally applicable to, and entirely encompasses, other optoelectronic devices, such as detectors, light-emitting diodes (LEDs), and semiconductor lasers.

Perovskite materials suitable for use in a hole transport layer generally include materials having the formula $ABX_3$, where A is an alkaline earth element, a rare earth element, or an organic compound; B is a transition metal, a Group 13 metal, a Group 14 metal, or a Group 15 metal; and X is a halogen. This includes organo halide perovskites, where A is an organic compound such as, but not limited to, an alkylammonium such as methyl ammonium, formamidinium, or 5-ammoniumvaleric acid. Non-limiting example B metals include Pb, Sn, Cu, Ni, Co, Fe, Mn, Pd, Cd, Ge, Cs, and Eu. Non-limiting example X halogens include I, Br, Cl, and F. However, as will be described more fully below, suitable perovskites also include other materials, such as those having the formula $ABZ_yX_{3-y}$, where A is an alkaline earth element, a rare earth element, or an organic compound, B is a transition metal, a Group 13 metal, a Group 14 metal, or a Group 15 metal, Z and Y are each halogens, though not the same halogen, and y ranges from 0 to 1.

Suitable perovskite materials include methylammonium lead halide perovskites, having the formula $CH_3NH_3PbX_3$ (or "MAPbX$_3$"), where X is a I, Br, Cl, or F. One non-limiting example is methylammonium lead iodide ($CH_3NH_3PbI_3$) perovskite (MAPbI$_3$). MAPbI$_3$ has a work function smaller than the work function of CdTe, but the lifetime of minority carriers in a MAPbI$_3$ film is very high with a decent mobility of the charge particles. Due to these important properties, MAPbI$_3$ is an advantageous hole transport layer for CdTe solar cells. Other non-limiting examples of suitable perovskite materials include methylammonium lead bromide ($CH_3NH_3PbBr_3$) perovskite (MAPbBr$_3$), methylammonium lead chloride ($CH_3NH_3PbCl_3$) perovskite (MAPbCl$_3$), and formadinium lead trihalide ($H_2NCHNH_2PbX_3$) perovskites, where X is I, Br, Cl, or F.

Suitable perovskite materials for the hole transport layer may also have a formula of $MAPb(Z_{1-x}Y_x)_3$, where Z is a first halogen, Y is a second halogen, and x ranges from 0 to 1. In some embodiments, Z is iodine and Y is bromine. Some non-limiting examples include $MAPb(I_{0.3}Br_{0.7})_3$, $MAPb(I_{0.9}Br_{0.1})_3$, $MAPb(I_{0.5}Br_{0.5})_3$, $MAPb(I_{0.7}Br_{0.3})_3$, and $MAPb(I_{0.1}Br_{0.9})_3$. As with other perovskites, the bandgap of these materials is tunable by composition. As the amount of Br is increased in these materials, the bandgap of the material is increased.

Other non-limiting example perovskite materials include $MAPbZY_2$ materials, where Z is a first halogen and Y is a second halogen, such as $CH_3NH_3PbIBr_2$, $CH_3NH_3PbBrCl_2$, $CH_3NH_3PbICl_2$, or $CH_3NH_3PbBrI_2$. Other non-limiting example perovskite materials include perovskites that comprise tin instead of lead, such as $CH_3NH_3SnICl_2$ or $CH_3NH_3SnIBr_2$.

MAPbX$_3$ materials are especially advantageous, providing benefits such as ease of film processing, bandgap tunability (in the range of from about 1.5 eV to about 2.3 eV), high absorption coefficient, low exciton binding energy, high charge carrier mobility, and a long carrier life time. The presence of an MAPbX$_3$ interface layer (i.e., a hole transport layer disposed between an absorber layer and a back contact) reduces recombination current density and reverse saturation current density.

Perovskite materials are inexpensive and require low energy to make Thin film fabrication of perovskites consumes less time, and the process is easier, compared to the fabrication of ZnTe. Large scale fabrication is straightforward. High quality perovskite films are easily fabricated. The organo halide perovskites in particular, such as methylammonium lead iodide ($CH_3NH_3PbI_3$ or MAPbI$_3$) as an example, possess several outstanding optoelectronic properties that make them ideal for photovoltaic (PV) applications. Perovskite-based solar cells are now comparable to other previously existing high efficient technologies, at least at the lab scale. MAPbX$_3$ thin films are easily synthesized in a solution-based method and are easily deposited at low annealing temperature, making them suitable for thin film photovoltaic manufacturing processes.

Perovskite materials of the formula $ABX_3$ can be prepared by dissolving $BX_2$ and AX in a solvent to form dissolved $ABX_3$, and then heating the mixture in the solvent to a temperature so that the $ABX_3$ structure forms, where the temperature corresponds to the inverse temperature solubility for dissolved $ABX_3$. This can be applied in the thin film context by creating a halide perovskite precursor solution composed of, for example, methylammonium iodide (MAI) and lead iodide (PbI$_2$) in a suitable solvent, coating the halide perovskite precursor solution onto the desired substrate (such as a CdTe semiconductor layer), such as via a spin-coating process, and annealing the coated substrate to form a film of MAPbI$_3$ thereon. The halide perovskite precursor solution may further include lead bromide, which results in incorporating bromine into the resulting perovskite (i.e., forming a $ABZ_yX_{3-y}$ perovskite) and thereby tuning the electronic properties of the perovskite. In general, the halide perovskite precursor solution may contain any combination of halides that results, after a heating and optional annealing process, in the formation of a perovskite. Suitable solvents for such a halide perovskite precursor solution include anhydrous dimethylformamide (DMF) dimethyl sulfoxide (DMSO), anhydrous isopropanol (IPA), and mixtures thereof. Optionally, chlorobenzene may be added during the coating process. The annealing step can conducted at a temperature ranging from about 75° C. to about 150° C., or preferably about 100° C., but is not strictly necessary.

Figure 3A:
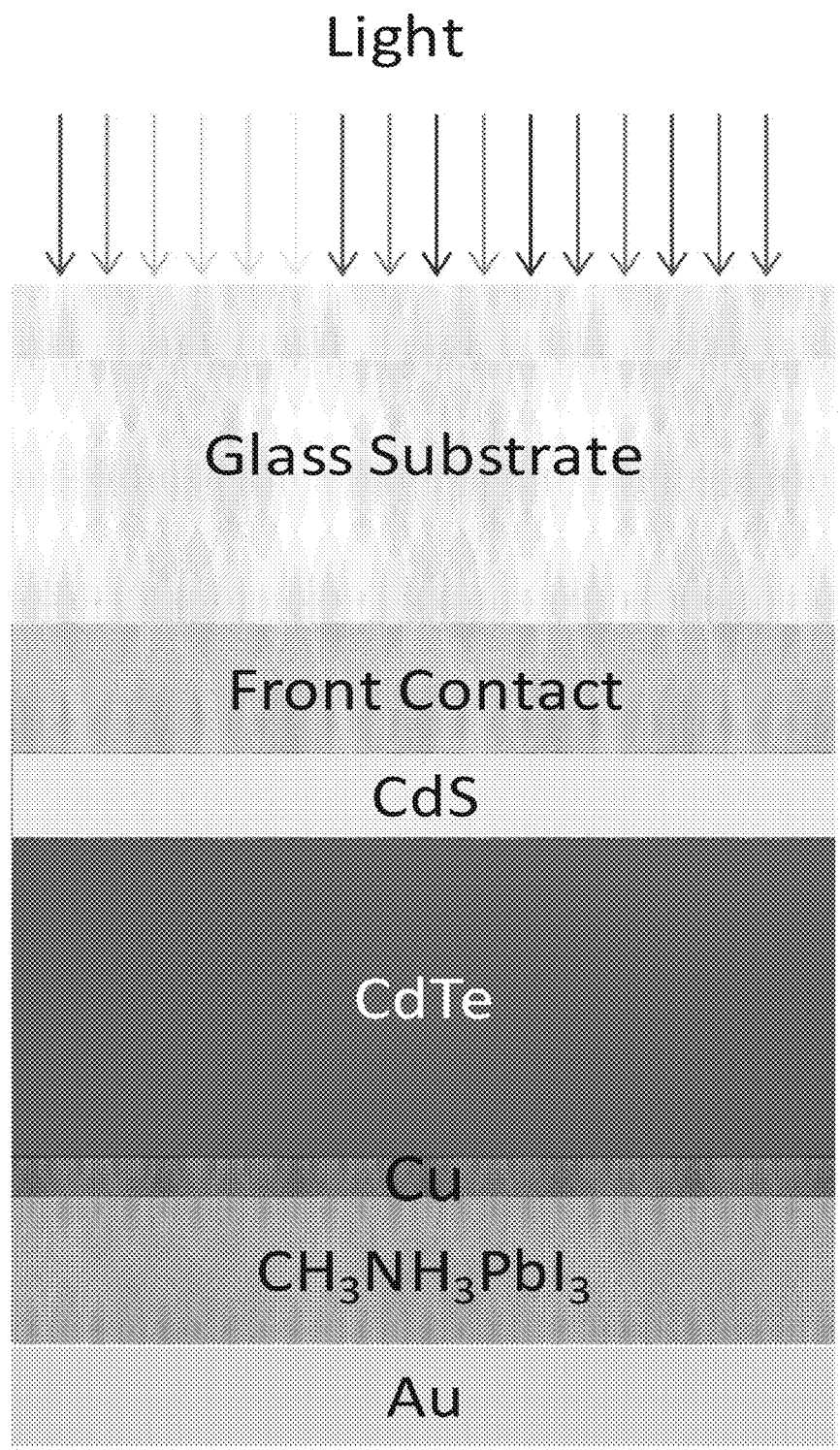
FIGS. 3A-3B: CdS/CdTe device structure when methylammonium lead iodide is used as a hole transport layer sandwiched between Cu and Au (FIG. 3A), and when a Spiro-OMeTAD layer is added to MAPbI$_3$ (FIG. 3B).

For clarity, it is noted that even though the perovskite is used to create a hole transport layer, the combination of the perovskite material and a conductive metal may together be referred to as a back contact or a back contact structure. For CdS/CdTe solar cells, conventional back contacts are commonly made with Cu/Au or Cu/graphite. Copper introduced at the back contact diffuses atomically to the CdS/CdTe junction, resulting in shunting at the n-p junction and doping of the CdTe layer p-type. The $CH_3NH_3PbI_3$/Au interface is not energetically favorable for efficient transport of photo-generated holes in the back contact metal due to the mismatch of work functions between the two layers. Therefore, conventional perovskite-based solar cells use a different hole transfer layer, such as a Spiro-MeOTAD layer, to increase the performance of the devices. However, in accordance with the present disclosure, a perovskite hole transport layer can be used in a CdTe-based photovoltaic device without an additional hole transport layer. For example, FIG. 3A depicts an embodiment where an organo halide perovskite film is sandwiched between Cu and Au. This structure results in improved $V_{OC}$ and FF.

Based on variations in the halide anion, cations, and with metal and related dopant atoms, the perovskite materials are substantially tunable. This means that by designing specific alloys, which may have unique crystalline structures, the electronic properties of the perovskite materials used in a hole transport layer on CdTe, or indeed on a wide range of other light-absorbing materials, can be tuned to optimize performance based on properties such as the valence band and conduction band locations relative to vacuum, the desired doping density, and the work function of the perovskite-based layer. As one non-limiting example, bromine can be introduced into the perovskite material to adjust the band gap as desired. Thus, the perovskite material can be, for example, $MAPbBr_yI_{3-y}$, where y ranges from 0 to 1.

Though the present disclosure is not limited to photovoltaic devices, photovoltaic devices are described for exemplary purposes. Referring now to FIG. 1, an example photovoltaic device 100 comprises a plurality of thin film layers deposited on a support 110. The support 110 is a transparent material, such as a sodalime glass. The photovoltaic device 100 includes a front contact or transparent conductive (TC) layer 120, which is typically a transparent conductive oxide (TCO). The TC layer 120 is a transparent thin film that is also a conductor of electrical charge. The TC layer 120 allows light to pass through to the active light absorbing material, and also serves as an ohmic electric contact (also referred to as the front contact) to transport photogenerated charge carriers away from the light absorbing material. The TC layer 120 may include a conductive oxide, such as tin oxide, zinc oxide, indium tin oxide (ITO), zinc stannate, cadmium stannate, or mixtures thereof. The TC layer 120 may also include one or more dopants, such as fluorine, tin, or aluminum. Commercially available TCO-coated glass substrates may be employed as supports.

The photovoltaic device 100 depicted in FIG. 1 includes a CdS window layer 130, and a CdTe absorber layer 140. The window layer 130, TC layer 120, and support 110 may be referred to together herein as a layer stack, where such term may optionally include any additional layers between the support 110 and the absorber 140. While the semiconductor layers are described in the context of CdS and CdTe layers, other materials may be used as suitable semiconductor layers in a photovoltaic device. For example, the various semiconductor active layers may alternatively be formed from materials such as CIGS (copper indium zinc gallium di-selenide), CZTS (copper zinc tin sulfide), CZTSSe (copper zinc tin sulfur selenium alloy), tin sulfide, or copper antimony sulfide. In the exemplified photovoltaic device 100, the CdS layer 130 is an n-type layer, and the CdTe layer 140 is a p-type layer, thereby forming a p-n heterojunction.

The CdS/CdTe layers 130, 140 may be grown by any suitable method, such as RF magnetron sputtering. As a non-limiting example, a CdS film 130 can be sputtered onto a TC layer 120 deposited on a soda lime glass substrate, on top of which CdTe 140 may be deposited by any suitable method, such as closed spaced sublimation (CSS). Independent of the deposition method, following the CdTe deposition, a $CdCl_2$ treatment is generally carried out, for example by dipping the CdTe layer 140 in a solution of $CdCl_2$-methanol and subsequently annealing at 378° C. in dry air to advance grain growth, release interfacial strain, and facilitate sulfur and tellurium mixing at the CdS/CdTe interface 135.

Following CdS/CdTe deposition, a layer of copper 150 is deposited, followed by a heating step to drive copper diffusion. For clarity, though FIG. 1 depicts a copper layer 150, it is understood that the layer of copper 150 may substantially diffuse away. In any event, the perovskite hole transport layer 160 is deposited on the copper layer 150. On the perovskite hole transport layer 160 is deposited a back contact metal layer 170, which is made of a suitable conductive material such as Au, Cu, Sb, Hg, Bi-telluride, or graphene. In one embodiment, the perovskite hole transport layer 160 and the back contact metal layer 170 can be applied to the cell without pre-treatment of the CdTe p-type film. The skilled person will recognize that many other configurations of CdTe-based photovoltaic devices employing a perovskite hole transport layer are possible and entirely encompassed within the present disclosure.

Figure 2:
FIG. 2: Schematic of a non-limiting example perovskite-based photovoltaic device that includes a CdTe electron transport layer.

In another aspect, provided herein is a perovskite-based photovoltaic device that includes an electron transport layer. In the device structure of conventional perovskite solar cells, a perovskite thin film interfaces with an electron contact layer (such as $TiO_2$ or PCBM) coated either on a transparent cathode (FTO) or on a metal cathode, depending on whether the device has an n-i-p or p-i-n structure. In accordance with the present disclosure, a CdTe layer can be used as an electron transport layer in a perovskite-based solar cell. Referring now to FIG. 2, an example perovskite-based photovoltaic device 200 generally includes a support 210, an electron contact layer 220, a CdTe electron transport layer 260, a perovskite absorber layer 240, and a hole contact layer 270. The support 210 may be the same as that described for CdTe-based photovoltaic devices. Similarly, the electron contact layer 220 may be composed of, for example, any of the TC layer materials described for CdTe-based photovoltaic devices, and the hole contact layer 270 may be composed of, for example, any of the back contact metal layer materials described for CdTe-based photovoltaic devices. The perovskite absorber 240 may include a perovskite material of the formula $ABX_3$ where A is an alkaline earth element, a rare earth element, or an organic compound; B is a transition metal, a Group 13 metal, a Group 14 metal, or a Group 15 metal; and X is a halogen. Alternatively, the perovskite absorber 240 may include a perovskite material of the formula $ABZ_yX_{3-y}$, where A is an alkaline earth element, a rare earth element, or an organic compound; B is a transition metal, a Group 13 metal, a Group 14 metal, or a Group 15 metal; Z and X are each halogens, though different halogens; and y ranges from 0 to 1. In any event, the CdTe in the electron transport layer 260 is generally doped n-type, and forms a p-n junction with the perovskite absorber material. Alternatively, the CdTe in the electron transport layer 260 may be substantially intrinsic, giving the perovskite photovoltaic device 200 an n-i-p structure.

It is understood that the photovoltaic devices of the present disclosure may further include various additional layers or coatings known in the art such as buffer layers, barrier layers, and anti-reflective coatings. Additionally, the photovoltaic devices may be multi-junction or tandem photovoltaic devices, where two or more sub-cells are connected on top of each other. Suitable tandem photovoltaic devices include those having a second type of absorber material in the second sub-cell. For example, a first sub-cell may include a CdTe absorber layer, and a second subcell may include a CdXTe absorber layer, where X is Zn, Mg or another metal. Furthermore, it is understood that various layers or process steps may be optional. For example, CdTe-based photovoltaic devices may be made without copper, where the hole transport layer is deposited directly on the CdTe layer, and although such embodiments may not be optimal, they are nonetheless encompassed within the present disclosure.

In another aspect, provided herein is a method of forming a diode. The formation of a Te-rich surface on a CdTe absorber layer is beneficial to the formation of a low barrier contact at the back junction in CdTe-based optoelectronic devices. Regardless of the CdTe fabrication method, various processes are used to form Te-rich surfaces. In accordance with the present disclosure, a CdTe surface may be contacted with an organo halide solution, composed of at least one organo halide in a solvent, to create a Te-rich surface, provided that an organic cation in the organo halide solution is capable of forming a nanocluster or low dimensional soluble structure with cadmium, such as a cadmium perovskite, in solution. Such cations include, but are not limited to, the methylammonium cation and the formamidinium cation. Suitable organo halides include, but are not limited to, methylammonium iodide (MAI, $CH_3NH_3I$), formamidinium iodide (FAI, $CH_5IN_2$), methylammonium bromide (MABr, $CH_3NH_3Br$), methylammonium fluoride (MAF, $CH_3NH_3F$), formamidinium bromide (FABr, $CH_5BrN_2$), formamidinium fluoride (FAF, $CH_5FN_2$), methylammonium chloride (MACl, $CH_3NH_3Cl$), formamidinium chloride (FACl, $CH_5ClN_2$), ethylammonium iodide (EAI, $C_2H_8IN$), ethylammonium chloride (EACl, $C_2H_8ClN$), ethylammonium bromide (EABr, $C_2H_8BrN$), ethylammonium fluoride (EAF, $C_2H_8FN$), propylammonium chloride (PACl, $C_3H_{10}ClN$), propylammonium bromide (PABr, $C_3H_{10}BrN$), propylammonium iodide (PAI, $C_3H_{10}IN$), propylammonium fluoride (PAF, $C_3H_{10}FN$), and combinations thereof. Suitable solvents for the organo halide solution include, but are not limited to, anhydrous dimethylformamide (DMF), dimethyl sulfoxide (DMSO), anhydrous isopropanol (IPA), or mixtures thereof. The organo halide may be present in the organo halide solution at a concentration ranging from about 10 mM to about 1M, or from about 100 mM to about 700 mM, or from about 200 mM to about 500 mM.

Figure 27A:
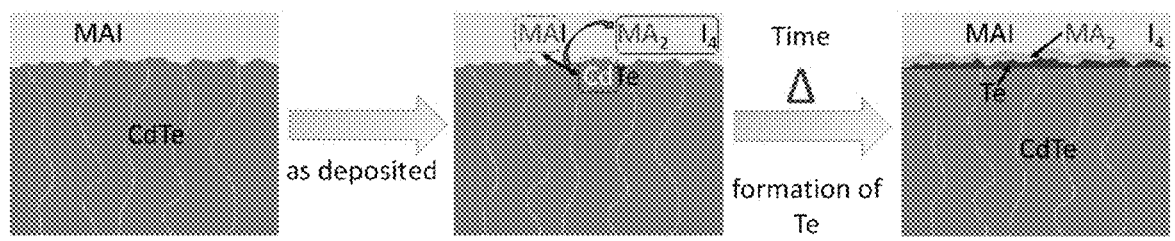
FIGS. 27A-27B: Illustrations depicting a process of treating CdTe with MAI.
Figure 27B:
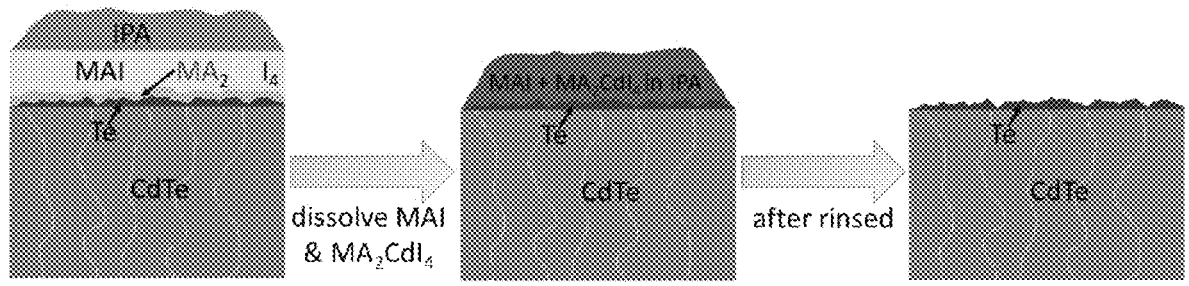

It has been found that by contacting a CdTe surface with a suitable organo halide solution, cadmium is selectively removed from the CdTe by complexation with an organic cation in the organo halide solution. This can be accomplished with contacting times from as short as about 5 seconds. For example, when MAI is used, complexes of $MA_2CdI_4$ form in the solution, selectively removing Cd from the CdTe and thereby forming a Te-rich surface or even a layer of Te on the CdTe surface. The mechanism by which this happens is illustrated in FIGS. 27A-27B. FIG. 27A depicts extracting Cd from the CdTe surface by forming $MA_2CdI_4$. FIG. 27B depicts removing $MA_2CdI_4$ and excess MAI. The same mechanism applies for other halides. Thus, $MA_2CdX_4$ complexes form on the CdTe surface, where X is the halogen (I, Br, Cl, F) present in the organo halide solution used to treat the CdTe surface.

To treat a CdTe surface, the CdTe surface may be contacted with the organo halide solution for a period of time, such as from about 5 seconds to about 5 minutes, or from about 10 seconds to about 90 seconds. The contacting may be through any of a number of methods. As one non-limiting example, the organo halide solution may be spin-coated on the CdTe surface at room temperature. Optionally, chlorobenzene may be deposited on the spinning sample during the coating. Alternatively, as another non-limiting example, the CdTe surface may be dipped or covered in the organo halide solution, such as a solution of 250 mM MAI in anhydrous IPA.

Regardless of the method of contacting the CdTe surface with the organo halide solution, the treated CdTe surface may then be heated, such as a through an annealing process at about 150° C. It has been found that an advantageous microstructure is grown on the CdTe surface following heating to at least 100° C. However, this heating step is not necessary; it is possible, and entirely encompassed within the present disclosure, to deposit a back contact layer or other layer onto the treated surface without first heating it.

Figure 26:
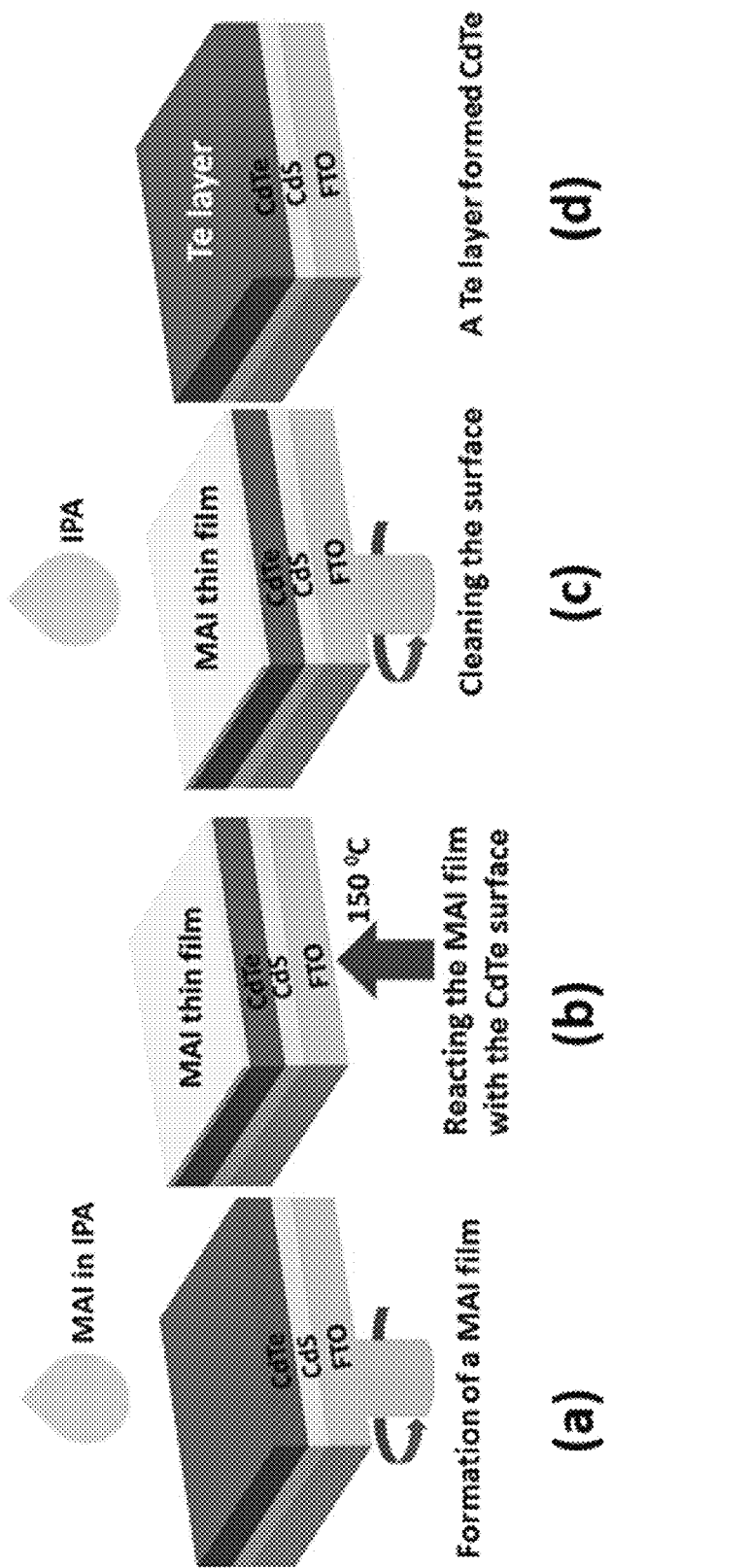
FIG. 26: Non-limiting example illustration of a process for treating CdTe with an organo halide solution of MAI.

Prior to forming the back contact, the treated CdTe surface may be cleaned by rinsing with a suitable solvent, such as with methanol or isopropanol, to remove excess organo halide solution and complexed cadmium, leaving behind a Te-rich surface. In some embodiments, as shown in FIG. 26 where an organo halide thin film layer is deposited on the CdTe layer, the resulting Te-rich surface is a layer of Te on the CdTe. Thus, the treatment with an organo halide solution results in a Te-rich region of the CdTe surface or even a layer of Te on the CdTe surface, either of which is advantageously suitable for back contact deposition using any suitable conductive back contact materials. The treatment process also creates a high surface area, as demonstrated in the examples herein.

Figure 12:
FIG. 12: Diagram of a layer stack produced from treating a CdTe surface with an organo halide solution.

Referring now to FIG. 12, a layer stack 300 made from treatment with an organo halide solution may include a layer 355 containing a cadmium perovskite complex in contact with the CdTe layer 340. The layer stack 300 includes a CdTe layer 340, a CdS layer 330, and a front contact 320 layer on a support 310. The layer stack 300 is useful for manufacturing photovoltaic devices. For example, the layer 355 containing cadmium perovskite complex can be removed, yielding a Te-rich CdTe surface ready for back contact deposition to create a photovoltaic device.

Creating a low-barrier, ohmic back contact to CdTe often involves addressing both the high work function and the low resistivity of the thin film. Standard back contact preparation often introduces copper, as a thin evaporated layer or as a CuCl$_2$ solution deposition, followed by thermally-assisted diffusion to create a low-resistivity Cu$_x$Te phase. It is known that Cu diffuses readily, and over time reaches the CdS/CdTe interface, reducing the operating voltage of the device. Copper diffusion therefore serves as a critical pathway to degradation, influencing device performance over the life of a PV system—ultimately degrading the economic performance of the technology. Alleviating the degradation associated with Cu diffusion has advantages for CdTe-based photovoltaic systems. Without wishing to be bound by theory, it is believed that by optimizing the CdTe treatment process described herein, the amount of Cu needed may be minimized.

EXAMPLES

Example I

This Example describes the application of methylammonium lead halide perovskite (CH$_3$NH$_3$PbBr$_y$I$_{3-y}$, MAPbBr$_y$I$_{3-y}$) films as hole transport layers in CdTe thin film solar cells.

Experimental Methods

Window, cadmium sulfide (CdS), and absorber, cadmium telluride (CdTe), layers were deposited by a vapor assisted transfer mechanism. The device structure of CdS/CdTe solar cells used in this Example is depicted in FIG. 3A, where CdS/CdTe layers were grown on a front electrode coated on a sodalime glass substrate. About 3 nm Cu was deposited onto CdCl$_2$-treated CdTe and annealed in dry air at 150° C. for 40 minutes. A thin layer of perovskite (PK) MAPbX$_3$ (X=Cl, Br, I) of thickness ~300 nm was then deposited onto CdTe using a spin coating. Finally, the device was completed by depositing 45 nm Au on top of MAPbX$_3$. For the standard Cu/Au back contact deposition, similar thicknesses of Cu and Au were sequentially deposited onto the CdCl$_2$-treated CdTe layer, and Cu diffusion was finally done at the end.

For both types of back contacts, the cell areas (0.85 cm$^2$) were defined by laser scribing. Current density-voltage measurements were performed in the dark and light at 1 sun AM1.5G illumination. External quantum efficiency (EQE) measurements were used to confirm J$_{SC}$ values.

A single-step deposition method was used to fabricate methylammonium lead halide perovskite (CH$_3$NH$_3$PbBr$_y$I$_{3-y}$, MAPbBr$_y$I$_{3-y}$) films on the CdTe layer. Precursor solutions for the perovskite fabrication were made by dissolving 0.8 M methylammonium iodide (MAI), and different concentrations of lead iodide (PbI$_2$) and lead bromide (PbBr$_2$) (the Pb concentration was set to 0.9 M) in a mixed solution of anhydrous dimethylformamide (DMF) and dimethyl sulfoxide (DMSO) (4:1 volume ratio). The precursor solution was spin coated on the CdTe layer at 1000 rpm for 10 s and 4000 rpm for 30 s at room temperature (~20° C.). During the second step, 100 µL of chlorobenzene was dropped on the spinning sample 15 s prior to the end. Then, the samples were annealed at 100° C. for 30 min to form MAPbBr$_y$I$_{3-y}$. The value of y was varied from 0.1 to 0.7, and MAPbBr$_y$I$_{3-y}$ is denoted as PK, PK1, PK2, and PK3 for y=0.1, 0.3, 0.5, and 0.7, respectively.

Figure 3B:
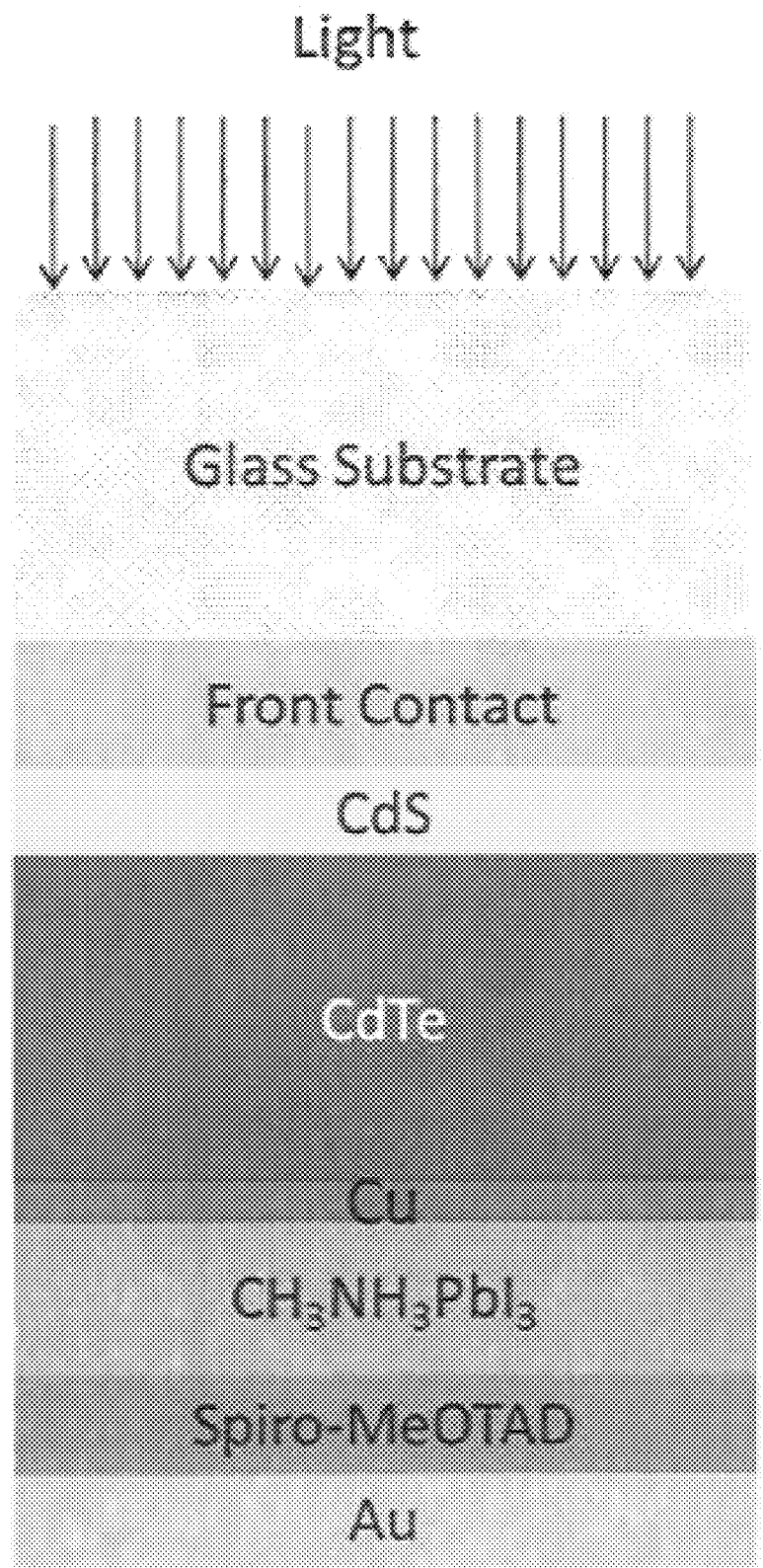

A comparative device was also made with a Spiro-MeOTAD layer, which is a conventional hole transfer layer, as shown in FIG. 3B.

Results and Discussion

Figure 4:
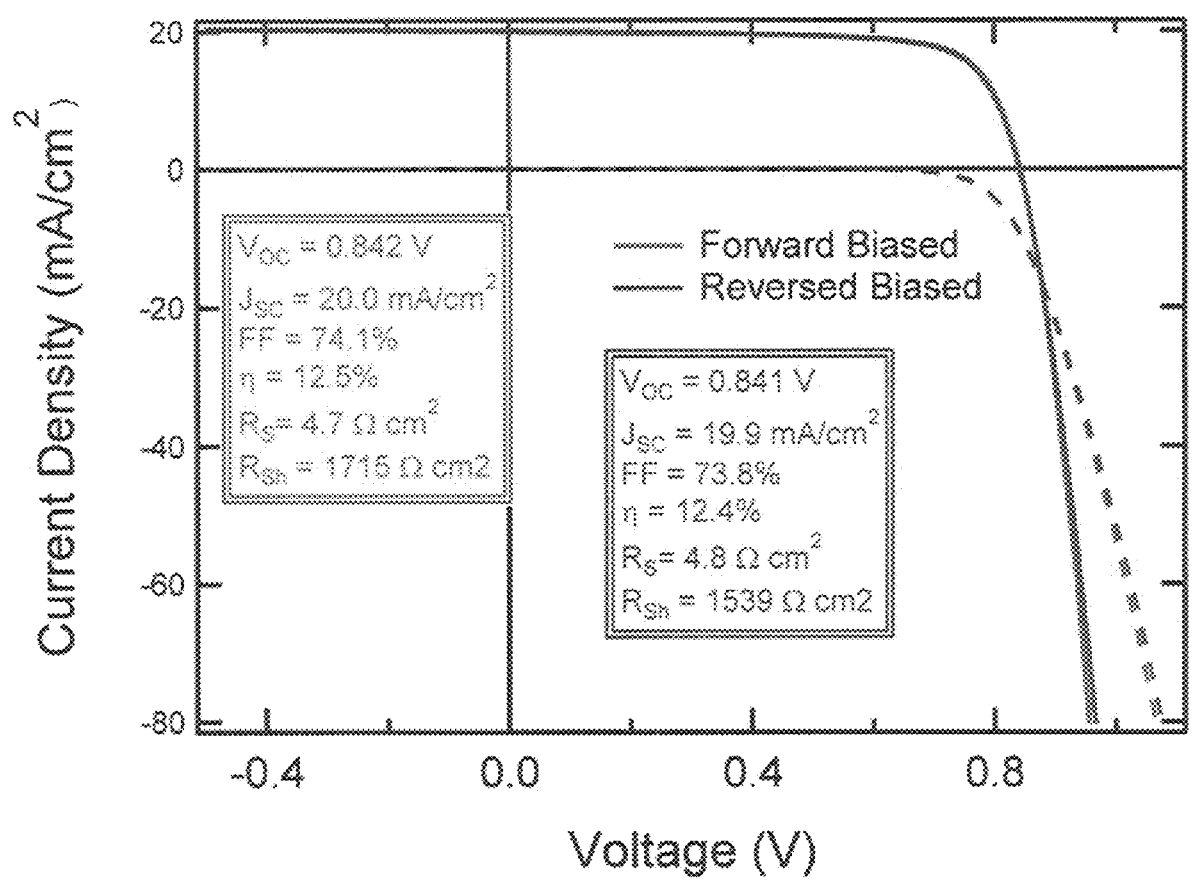
FIG. 4: Graph of J-V characteristics when scanning from forward and reverse bias voltage for a CdS/CdTe/Cu/perovskite/Au device.

FIG. 4 shows current density voltage characteristics of the device shown in FIG. 3A when the device was biased from forward to reverse and vice versa. The solid lines represent light measurements and the dashed lines represent dark measurements, respectively. FIG. 4 shows that the device generated very little or negligible hysteresis. The open circuit voltage (V$_{OC}$) of the solar cell was higher than using a standard (Cu/Au) back contact. Maximum V$_{OC}$ was as high as 0.853 V, but FF for that particular device was comparatively smaller. Performance was very good, even when the perovskite was deposited without its hole transfer layer (Spiro-MeTAD). These results demonstrate the effectiveness of MAPbI$_3$ as an interface layer in a CdS/CdTe photovoltaic device.

Figure 5:
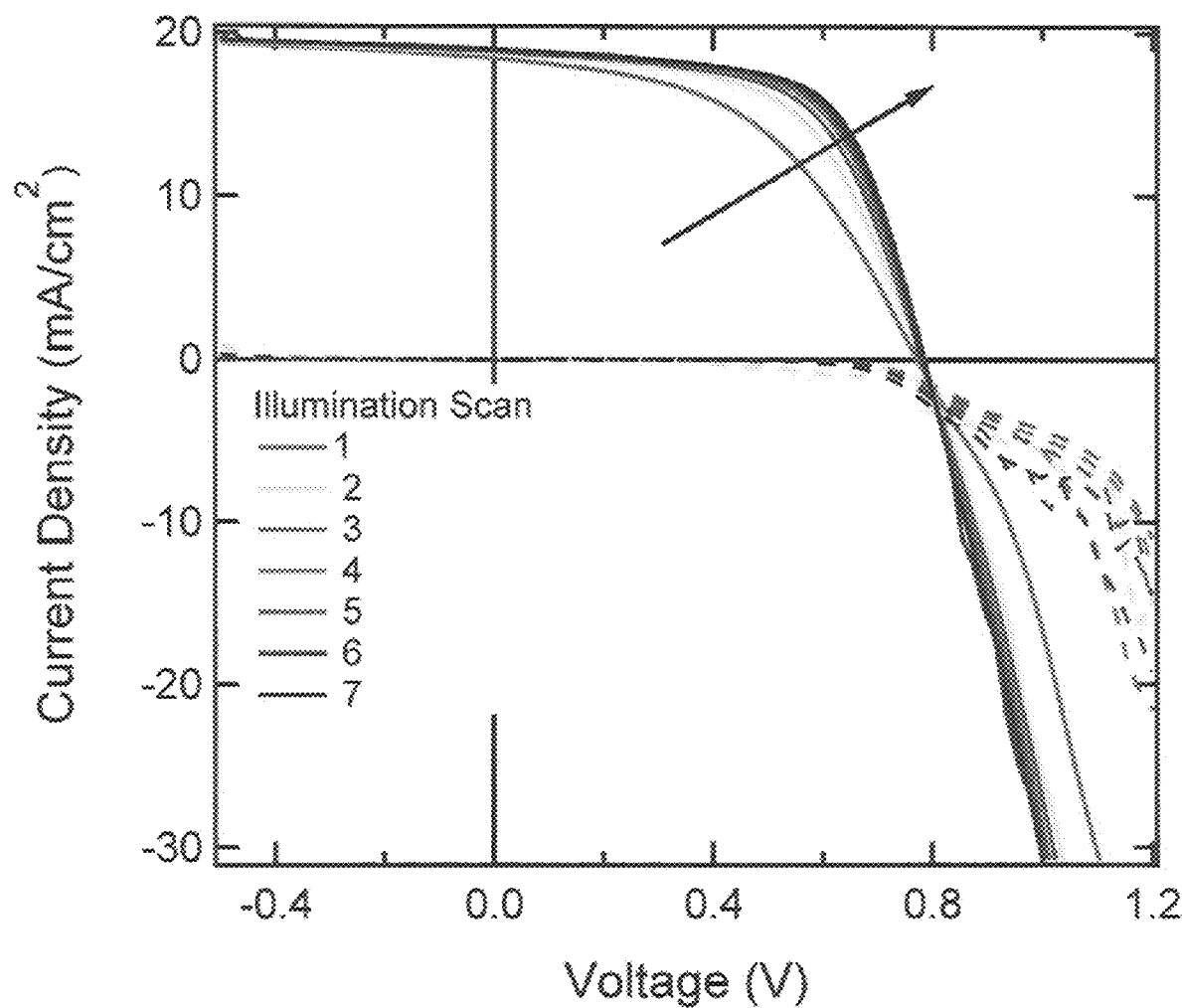
FIG. 5: Graph of J-V characteristics showing light soaking effect of CdS/CdTe device when MAPbI$_3$/Au is used as a back contact without the use of Cu.

The MAPbI$_3$ layer was also deposited onto the CdS/CdTe layer stack without the application of Cu. FIG. 5 shows J-V data of the resulting cell when light a soaking effect was performed. When each cell was illuminated again and again, performance was found to increase. As shown in FIG. 5, the efficiency was found to increase from 6.9% to 9.6% when the device was illuminated seven times. It is notable that even without the use of Cu, the devices showed current density vs. voltage behavior that exhibits no S-kink or rollover.

Figure 6A:
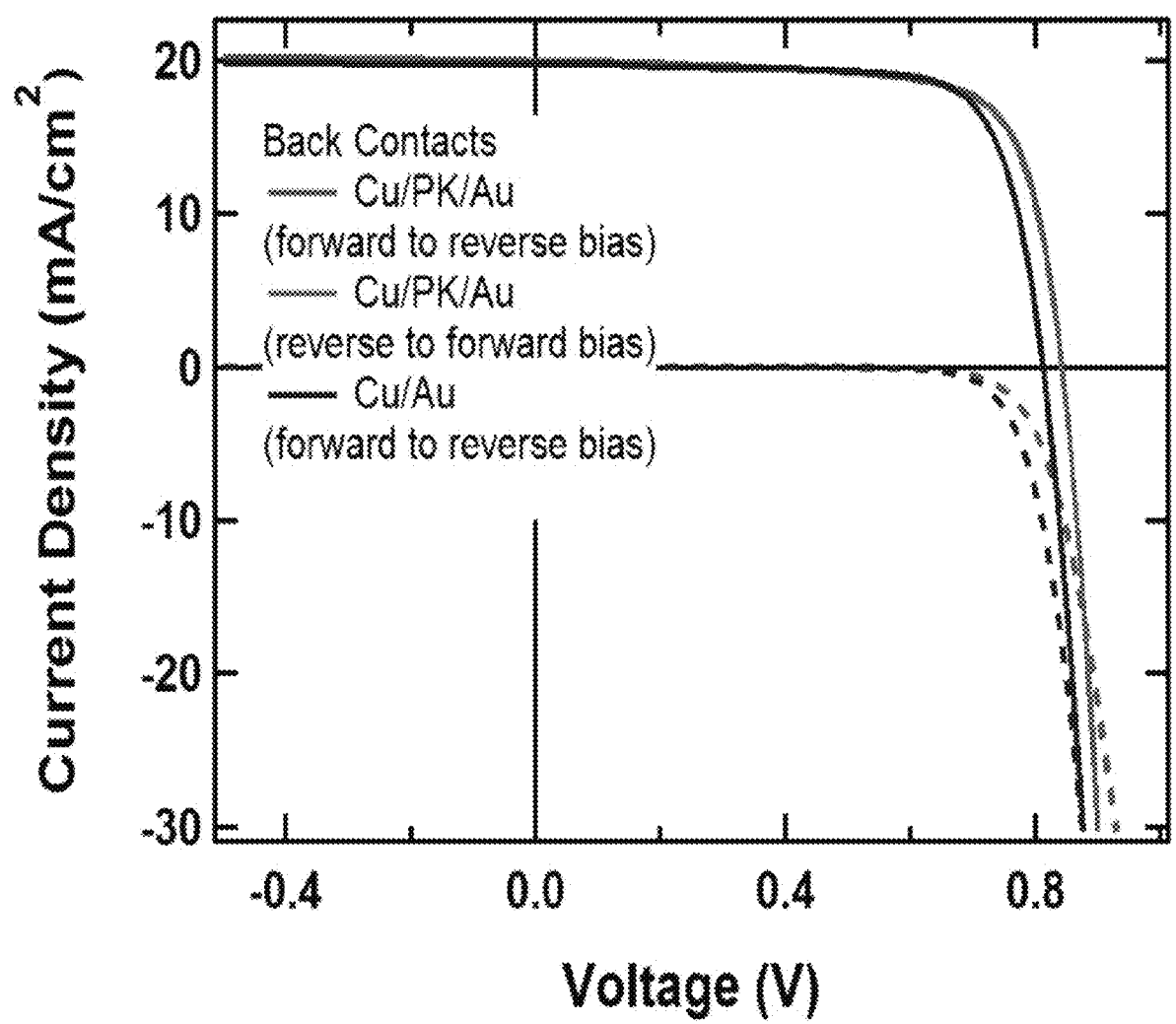

Current density voltage (J-V) curves for the best device using each of the two back contact designs are shown in FIG. 6A. For the perovskite back contact structure (i.e., Cu/perovskite/Au), J-V measurements were conducted in forward to reverse and reverse to forward bias voltage directions to see any changes in the performance, as changes have been seen in perovskite thin film solar cells where perovskite is used as an absorber layer. The J-V characteristics parameters for each type of contact are shown in Table 1 (FIG. 6C). Performance improvement of these devices is measured with respect to the standard back contact in laboratory scale.

Figure 6B:
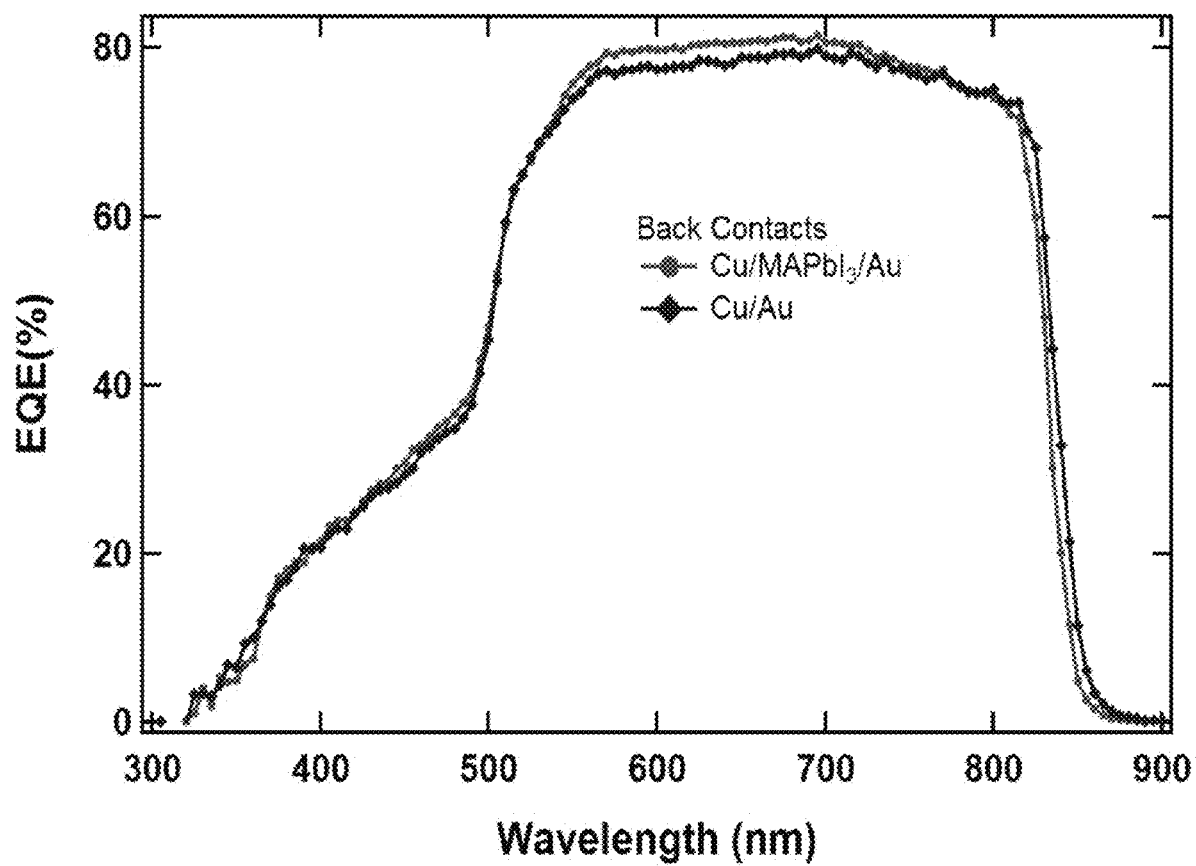

From the J-V curves shown in FIG. 6A, and the parameter values in Table 1, improvement in open circuit voltage (V$_{OC}$) can be clearly seen for the back contact structure having a perovskite hole transport layer under identical conditions. Short circuit current densities identical in all back contacts but lower in comparison to normal CdTe solar cells are severely affected by a slightly thicker CdS layer, as is clear from the collection loss in the wavelength range from 400 nm to 512 nm shown in the external quantum efficiency (EQE) data in FIG. 6B. Preliminary and non-optimized back contacts with a perovskite hole transport layer have shown >3% improvement in efficiency, even though FF is slightly smaller than with a standard back contact.

Figure 7A:
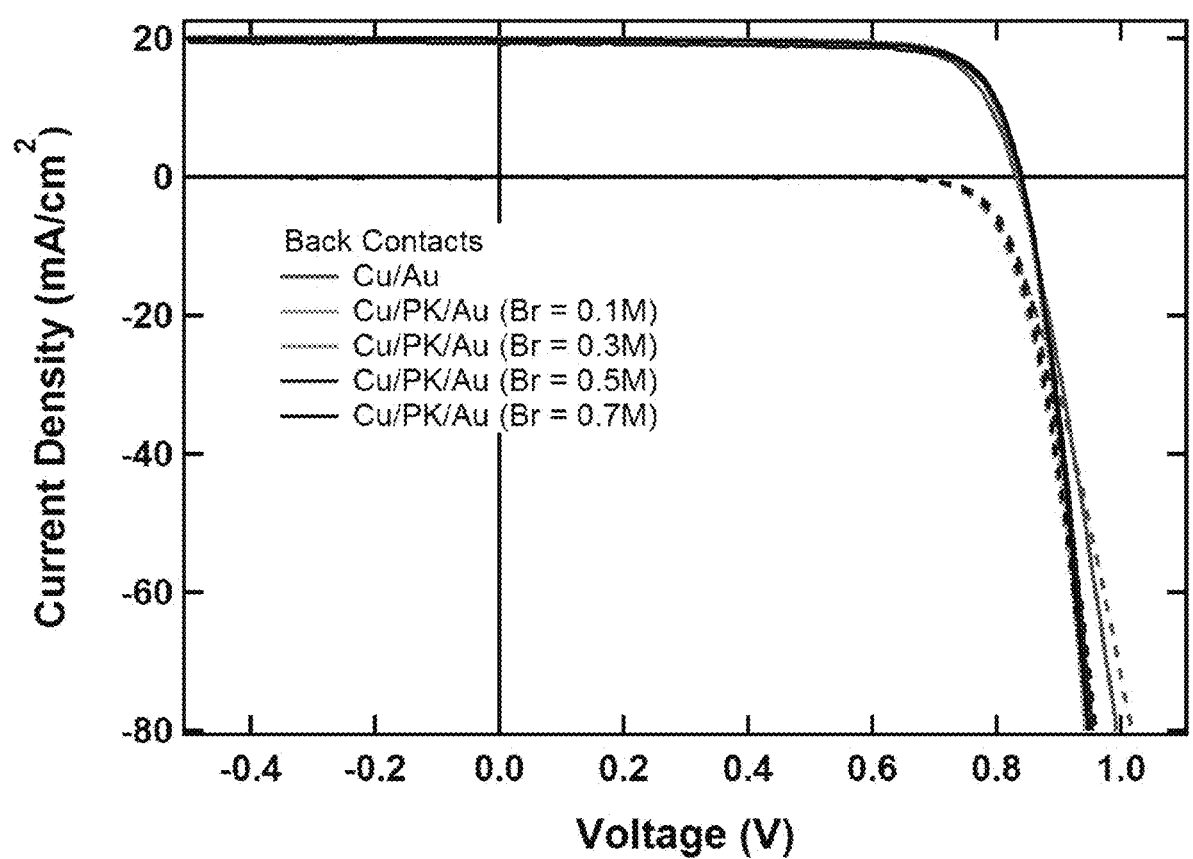

Since the electron affinity of MAPbI$_3$ is ~4.1 eV and the band gap is 1.55 eV, its work function closely matches with the work function of Au. This creates a large valence band offset between MAPbI$_3$ and CdTe, and generates a barrier to the photo-generated holes to reach the back contact metal. The band gap of MAPbI$_3$ can be tuned in the range of 1.55 to 2.3 eV by introducing Br to the formation of MAPbBr$_y$I$_{3-y}$. When the band gap increases, the top of the valence band shifts to higher energy and minimizes the valence band offset with the CdTe, creating a barrier-free interface. Bromine was incorporated into the perovskite layer to demonstrate the tunable band gap of the MAPbX$_3$ material. Results at various values of y are shown in FIG. 7A, and the corresponding characteristics J-V parameters are shown in Table 2 (FIG. 7B). In FIG. 7A, efficiency improvement by 4% is observed when introducing thin layer of MAPbBr$_y$I$_{3-y}$, with the values of y ranging from 0.1 to 0.7. As shown in Table 2, a 3% increase in FF is seen with the introduction of a thin layer of perovskite. This increase in FF is related to the improvement in crossover between the illumination and dark current density-voltage as shown in FIG. 7A. The crossover as seen in the Cu/Au back contact is eliminated when a thin layer of MAPbBr$_y$I$_{3-y}$ is sandwiched between Cu and Au. Light dependent forward current and voltage dependent carrier collection are responsible for factors causing crossover effect in thin film solar cells. Due to the existence of back barrier in Cu/Au back contact and defect states present on the CdTe or on CdTe/Au interface, recombination loss is increased with the illumination in forward bias. On the other hand, when a MAPbBr$_y$I$_{3-y}$ layer is included, recombination loss is minimized due to the decrease in contact barrier. In this case, the saturation value of the junction voltage is similar in the light and dark conditions such that the output current under illumination in forward bias is just shifted with respect to dark, but both are superimposing to each other.

Example II

A tellurium-rich surface on a CdTe layer is often employed to lower the back barrier effect and increasing the V$_{OC}$ and FF in the devices. In the process of the application of perovskite thin films on the CdTe surface, it was determined that a halide perovskite precursor solution, such as the non-toxic methylammonium lead iodide (MAI), can be used as an efficient surface treatment material for a CdTe surface for the formation of Te-rich surface. In this Example, the non-toxic methylammonium iodide (MAI) is shown to efficiently treat the CdTe surface. The J-V characteristics analysis indicates a reduction in the Shottky barrier at the back contact due to the surface treatment and selective removal of Cd by complexation. As a result, devices constructed with the MAI-treated CdTe absorbers exhibited higher photovoltaic parameters of open circuit voltage (V$_{OC}$) and fill factor (FF) relative to similar devices prepared without organo halide treatment. The treatment time of 40 s showed the best power conversion efficiency (PCE) of 13.7% while without treating the standard device efficiency was 13.2%.

Creating an efficient and stable back contact is important to achieve high efficiency with long-term stability in CdTe solar cells. Since CdTe has a high electron affinity, a high work function metal is required to form a low resistance ohmic contact; however, no metals have a work function high enough to form an Ohmic contact with p-type CdTe. Therefore, the metal/CdTe junction results in a Schottky barrier. This increases the contact resistance and causes lower device performance A common approach to overcome this problem is to use a thin intermediate degenerated semiconductor layer that increases the conductivity and forms a tunneling barrier between the CdTe and metal interface. Cu$_x$Te, the most used degenerated semiconductor, is formed by depositing a thin Cu layer (~3 nm) on the CdTe surface and annealing the sample to induce intermixing. To improve the Cu$_x$Te tunnel junction, a Te-rich surface on the CdTe layer is often employed. Wet-chemical etching processes, such as bromine-methanol etch (BrMeOH etch)—using a diluted solution of bromine in methanol—and nitric-phosphoric etch (NP etch)—using a mixture of nitric and phosphoric acid in water—and dry etching in Ar plasma are the commonly used surface etching techniques in CdTe solar cell fabrication. In contrast, deposition of a Te layer using close space sublimation (CSS) and chemical bath deposition have also been used to form a Te-rich surface on the CdTe absorber.

In this Example, a wet-chemical treatment process was used to form a Te-rich surface using methylammonium iodide (MAI) solutions. Facile preparation, less toxicity, and high controllability are the main advantages of this process. MAI in isopropanol (IPA) solutions were used to treat the CdTe surface and the effect of treatment time on the surface morphology, structure, and device performance were investigated. Current density-voltage (J-V) characteristics showed a reduction in the Shottky barrier at the back contact of CdTe solar cells with the MAI treatment. This reduction improved the photovoltaic device parameters of open circuit voltage (V$_{OC}$) and fill factor (FF), resulting in higher PCE (13.7%) relative to standard devices prepared without treatment (13.2%).

Treating the CdTe Layer

CdS and CdTe deposited onto fluorine-doped SnO$_2$ glass substrates using a commercial vapor transport were used to study the effect of MAI treatment. CdCl$_2$ was deposited on the CdTe film and annealed at 387° C. in dry air environment for 30 min to activate the device, followed by thorough rinsing with methanol to remove excess CdCl$_2$. Then, the CdTe surface was covered with 500 µL of 250 mM MAI in anhydrous IPA. After letting the solution sit on the CdTe layer for various treatment times of 20 s, 40 s, 60 s, and 80 s, the solution was removed by spinning the sample at 4000 rpm for 20 s. The treated samples were heated to 150° C. for 5 min and the surface was cleaned using methanol to remove excess MAI.

Solar Cell Preparation

After treating the CdTe surface, 3 nm of Cu and 30 nm of Au were deposited as the back contact using thermal evaporation without breaking vacuum. The samples were then annealed at 150° C. for 45 min to form the Cu$_x$Te layer and back contact. Individual cells were scribed to 3 mm×3 mm. The active area of the fabricated solar cells was 0.084 cm$^2$.

XRD Spectra

XRD was used to investigate the effect MAI treatment has on the surface stoichiometry. The XRD spectra (FIG. 8) of the standard and treated CdTe samples all show three main diffraction peaks at the 2θ angles of 23.8°, 39.3°, and 46.4°, corresponding to the diffraction from the (111), (220), and (311) crystalline planes of cubic CdTe, respectively. After surface treatment, two new XRD peaks at the 26.5° and 27.5° appear. These peaks are due to hexagonal Te (PDF: 97-009-6502) and orthorhombic TeO$_2$ (PDF: 97-003-4423) structures, indicating that MAI treatment removes Cd from the surface.

Variation of the Surface Morphology

Figure 9A:
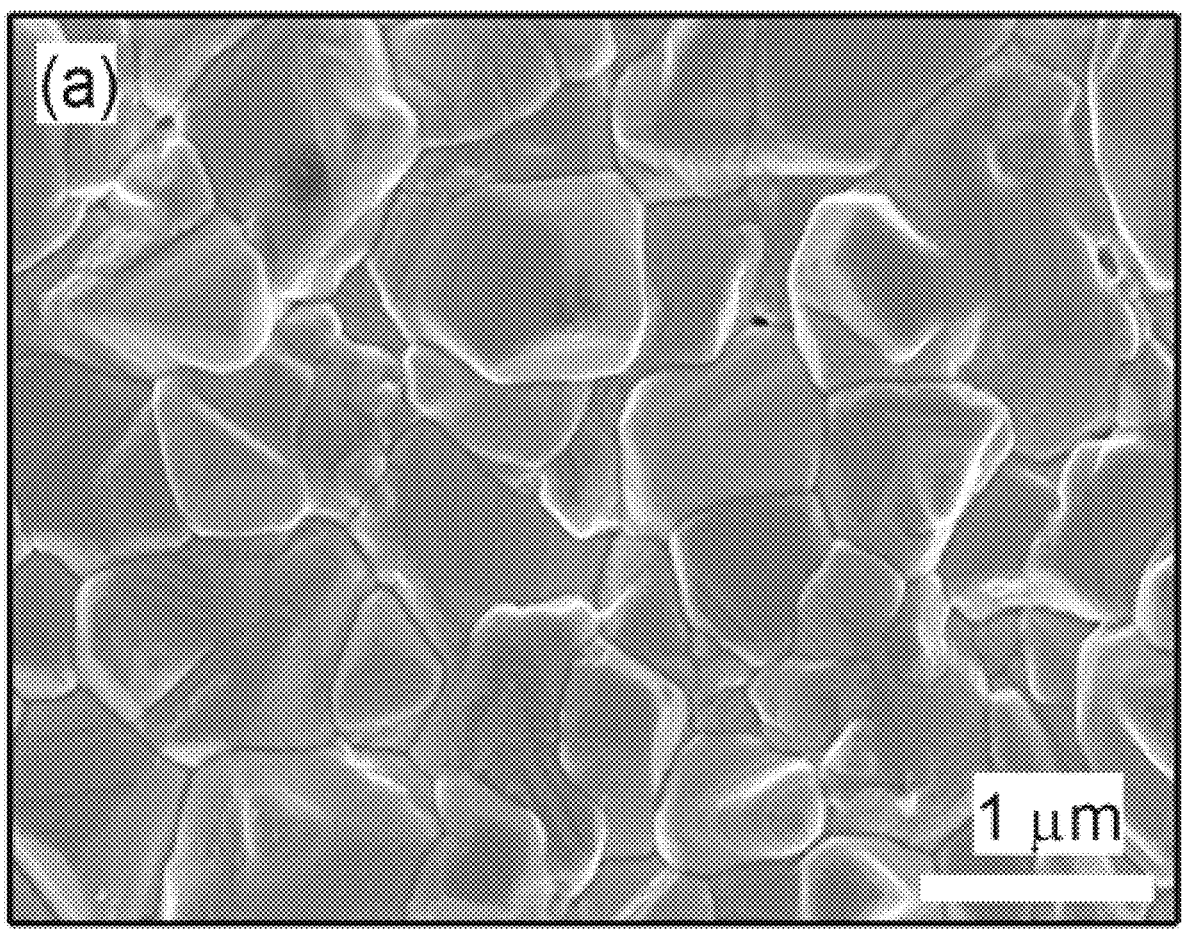
FIGS. 9A-9D: SEM images of as deposited (FIG. 9A) and CdCl$_2$-treated (FIG. 9B) CdTe samples.
Figure 9B:
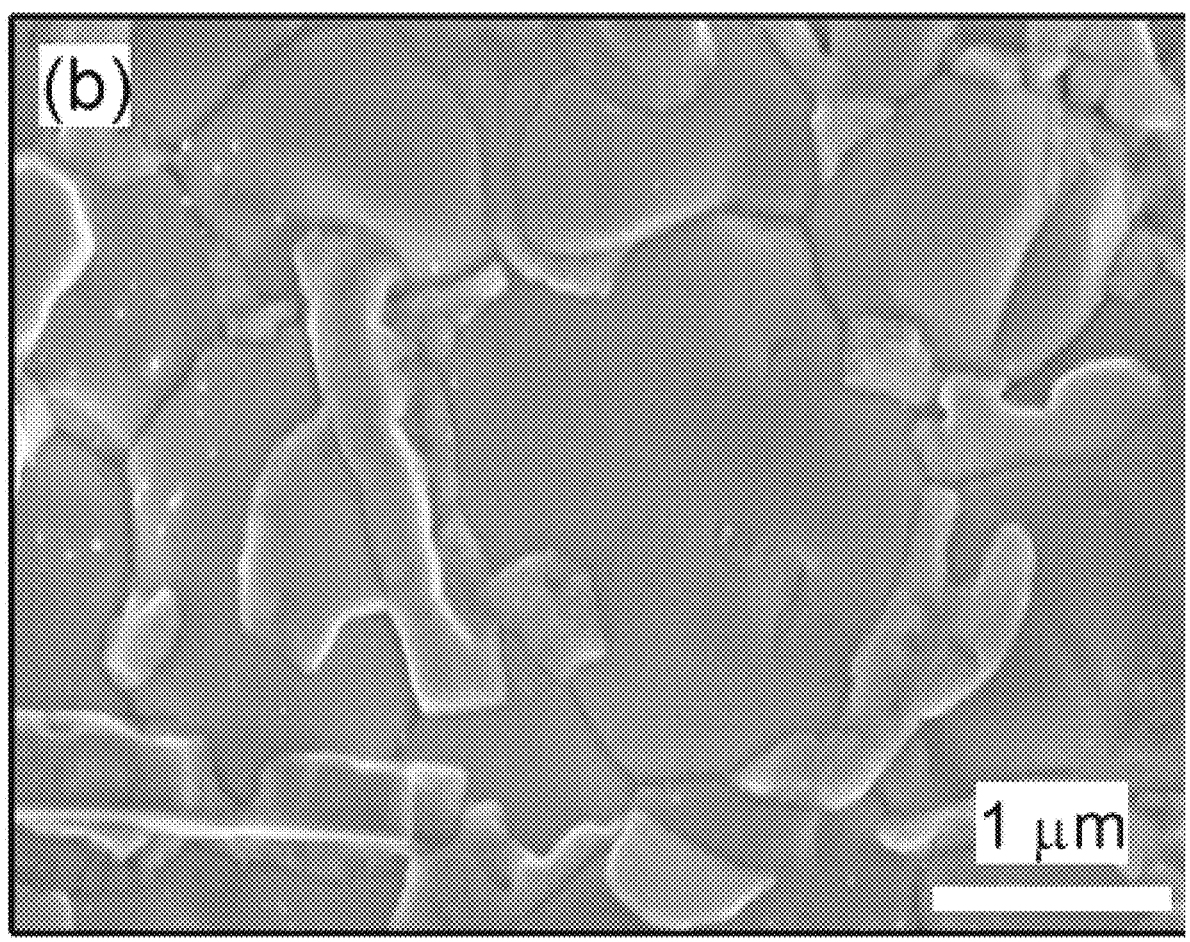

To examine the impact of MAI treatment on the morphology of the CdTe surface, SEM images (FIGS. 9A-9S) of the samples were obtained. FIGS. 9A-9B show the surface morphology of as-deposited and CdCl$_2$-treated CdTe samples.

Figure 8:
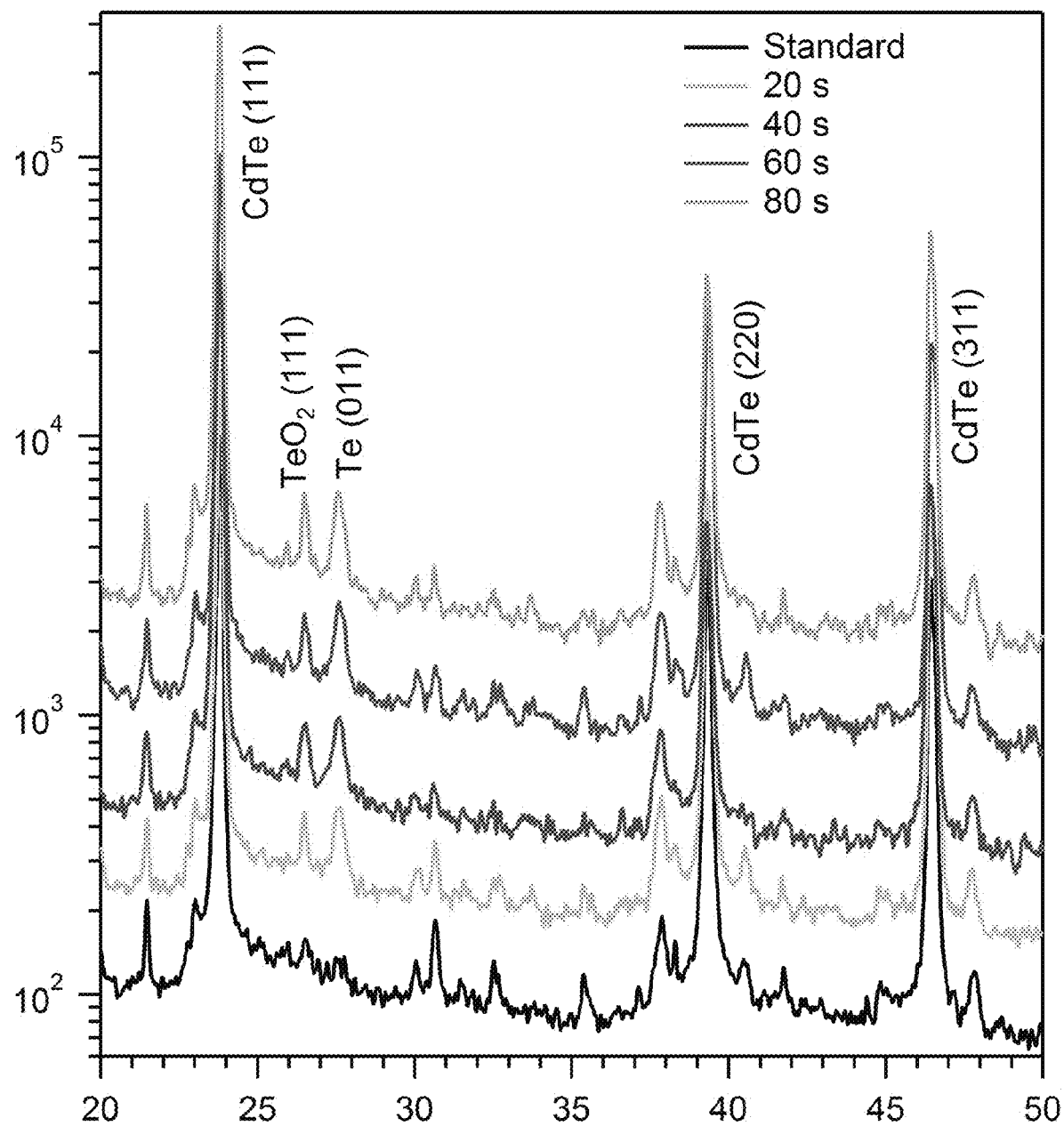
FIG. 8: X-ray diffraction patterns from treated (with 20 s, 40 s, 60 s, and 80 s treatment times) and untreated CdTe/CdS samples.
Figure 9C:
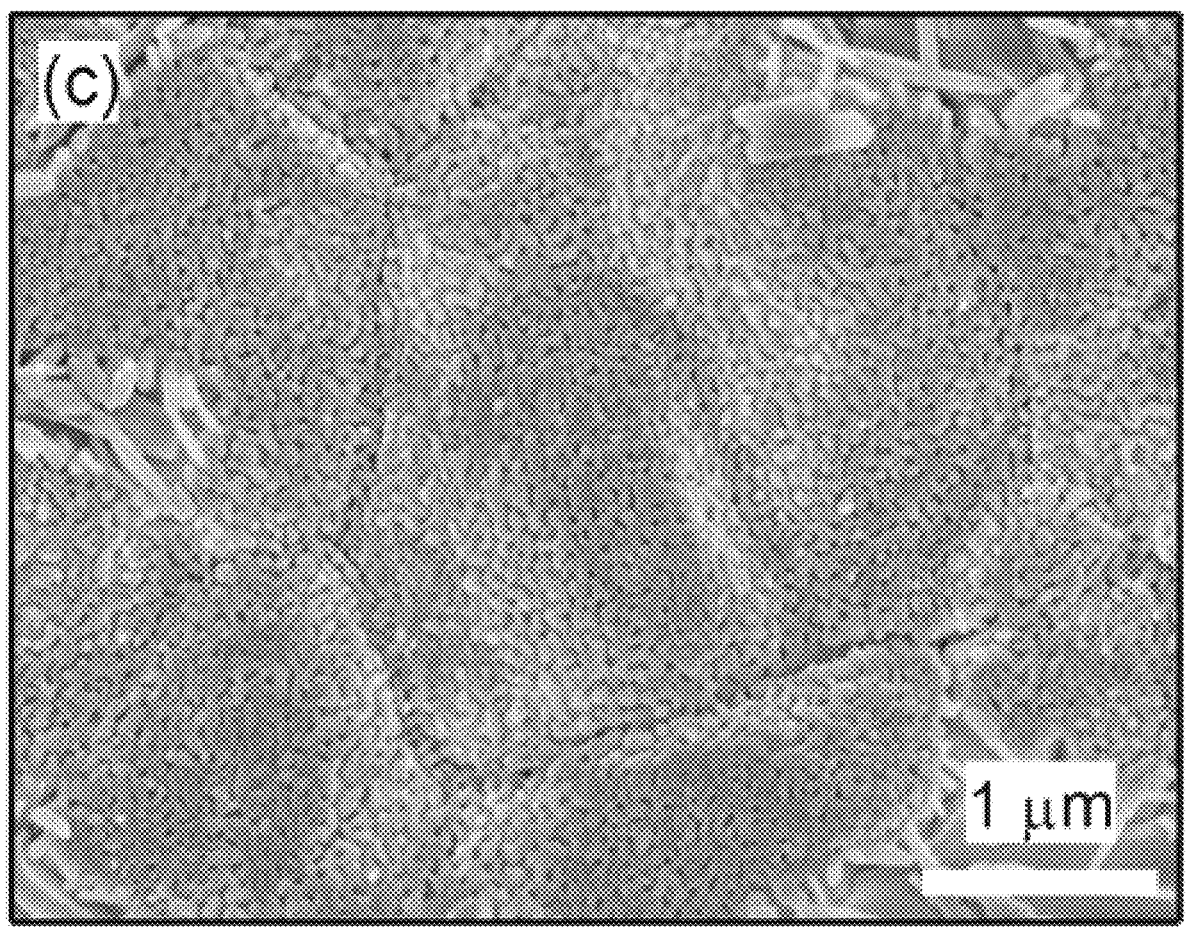
Figure 9D:
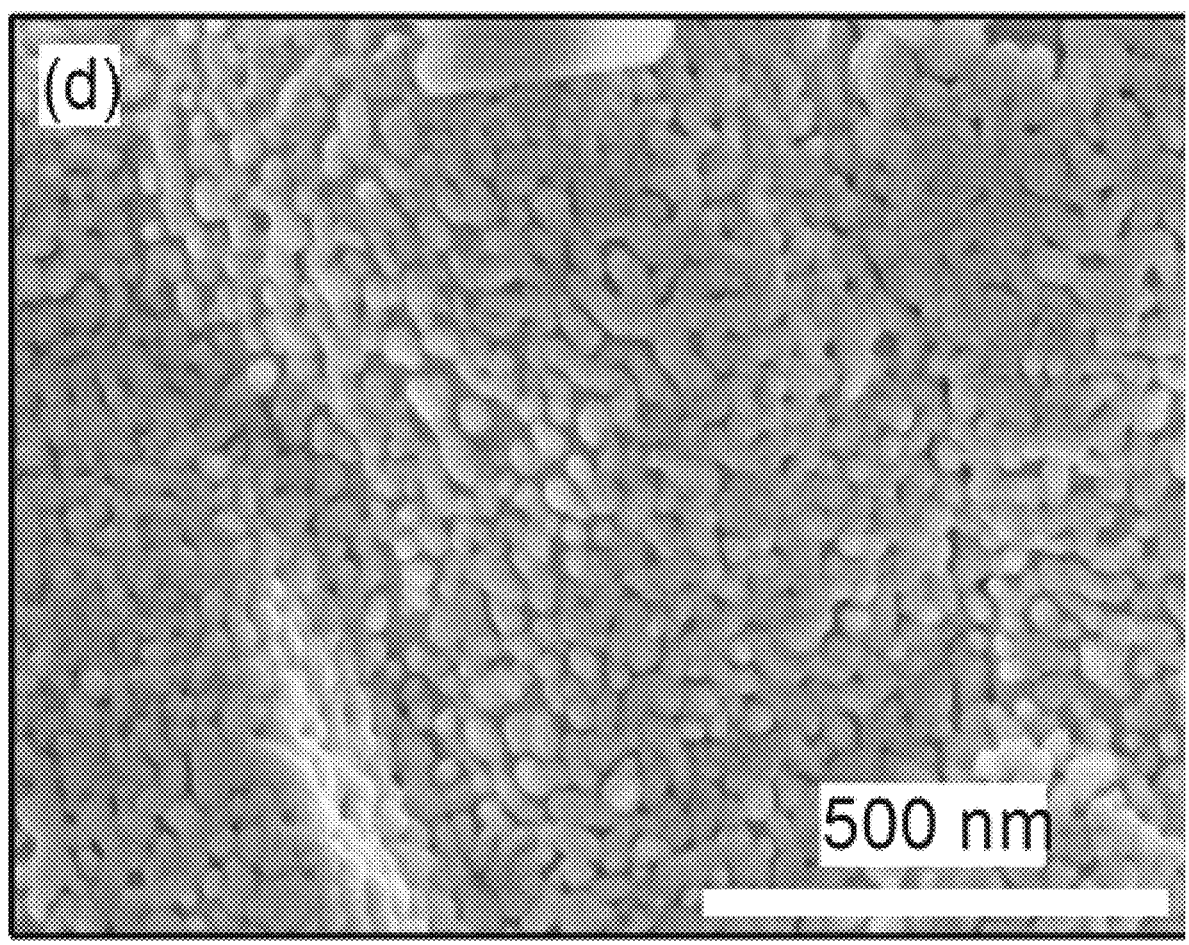

The surface after the CdCl$_2$ treatment appears rougher than the as-deposited CdTe. Small grains which are near large grains can melt and re-crystallize during the CdCl$_2$ treatment, resulting in increased surface roughness. The morphology of the CdTe surface was dramatically changed with the MAI treatment. FIGS. 9C-9D show the surface morphology of a CdTe sample after a 20 s of treatment. Small islands were formed on the CdTe surface. Without wishing to be bound by theory, it is believed that these islands are the nucleation of Te. MAI complexes with Cd$^{2+}$ cations in IPA solutions. When the MAI solution contacts the CdTe surface, it forms a MAI/Cd complex in solution, leaving a Te-rich layer on the CdTe film. Either the complexing process or the subsequent anneal results in the nucleation of the Te, which is detected in the XRD measurement (FIG. 8). The TeO$_2$ forms when the Te surface is exposed to air. Significant changes of the surface morphology images were not observed with changing the treatment time.

Device Performances

Complete devices were fabricated to study the effect of MAI treatment on the device performances. Table 3 (FIG. 10) shows the photovoltaic device parameters of $V_{oc}$, short circuit current density ($J_{sc}$), FF, and PCE of devices treated for various times. The MAI treatment mainly affected the $V_{oc}$ and FF, and all the treated samples showed higher average $V_{oc}$ than the standard. Improved average FF was observed for the devices made with the treatment time of 20 s and 40 s. The highest efficiency of 13.7% was achieved with the 40 s treatment time with the photovoltaic parameters of 818 mV of $V_{oc}$, 21.9 mA/cm$^2$ of $J_{sc}$, and 76.1% of FF. The best standard devices without treatment had the efficiency of 13.2% with 813 mV of $V_{oc}$, 22.1 mA/cm$^2$ of $J_{sc}$, and 73.3% of FF.

Figure 11:
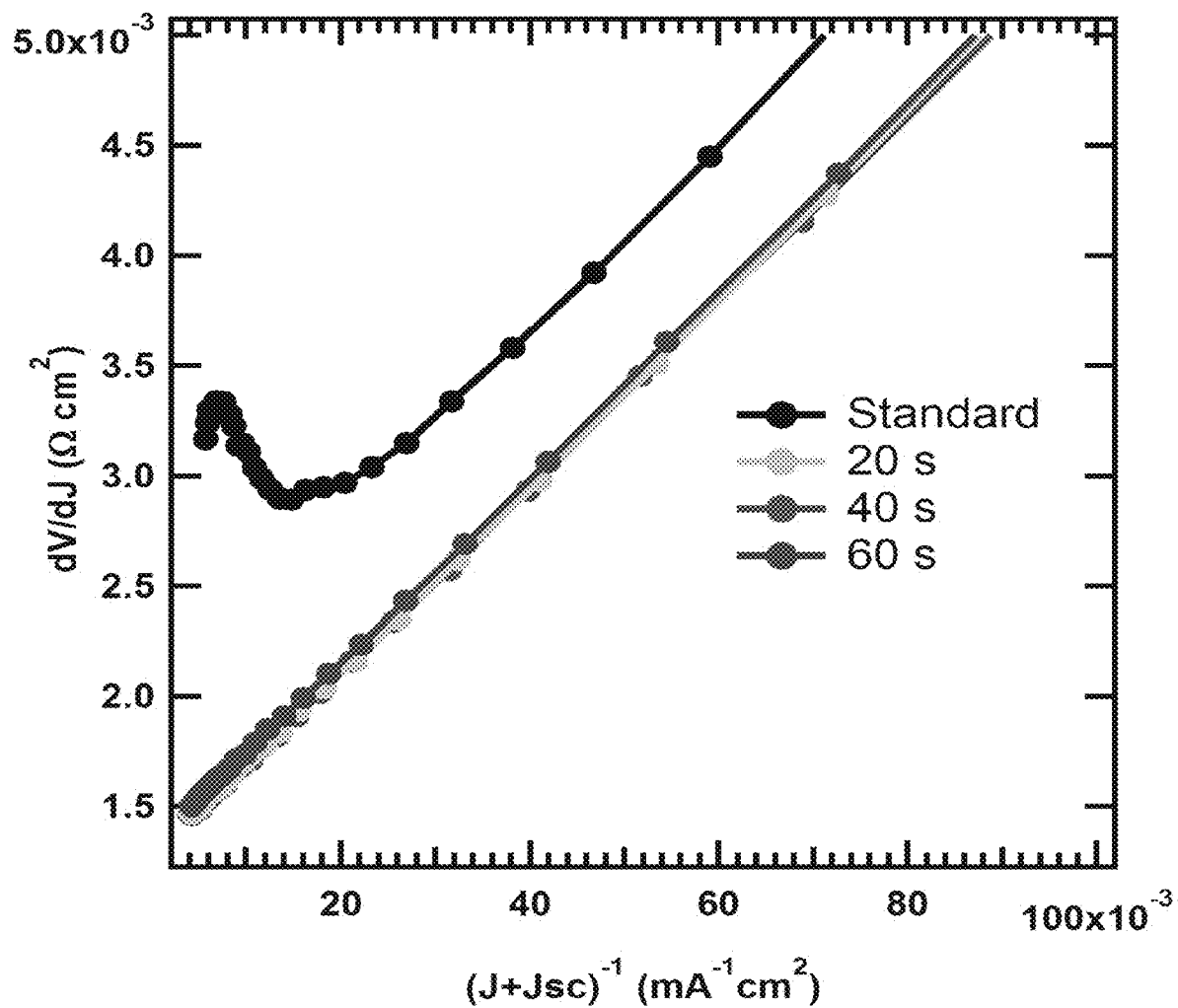
FIG. 11: Plot of the derivative dV/dJ against $(J+JSC)^{-1}$ for standard and the MAI treated samples.

To better understand the effect of the treatment on the back contact barrier, the derivative dV/dJ was plotted against $(J+JSC)^{-1}$ using the obtained J-V light curves (FIG. 11). The standard device shows a nonlinear behavior (blocking behavior) in the far forward bias region, while all the treated samples show linear behavior. Therefore, the $V_{oc}$ and FF improvements can be attributed to the reduced Shottky barrier at the back contact due to the efficient formation of $Cu_xTe$ at the interface of CdTe/Au.

Conclusion

This Example demonstrates that the non-toxic methylammonium iodide (MAI) can treat the CdTe surface to form a low resistive Te-rich surface. The MAI treatment process reduces the Shottky barrier at the back contact, resulting in improved $V_{OC}$ and FF in CdTe solar cells. Short treatment times are sufficient for good photovoltaic improvements. Both 20 s and 40 s treatment times showed similar average PCEs, but the treatment time of 40 s obtained the highest device efficiency of 13.7%, while the champion device efficiency of the standard sample without treatment was 13.1%.

Example III

Figure 13A:
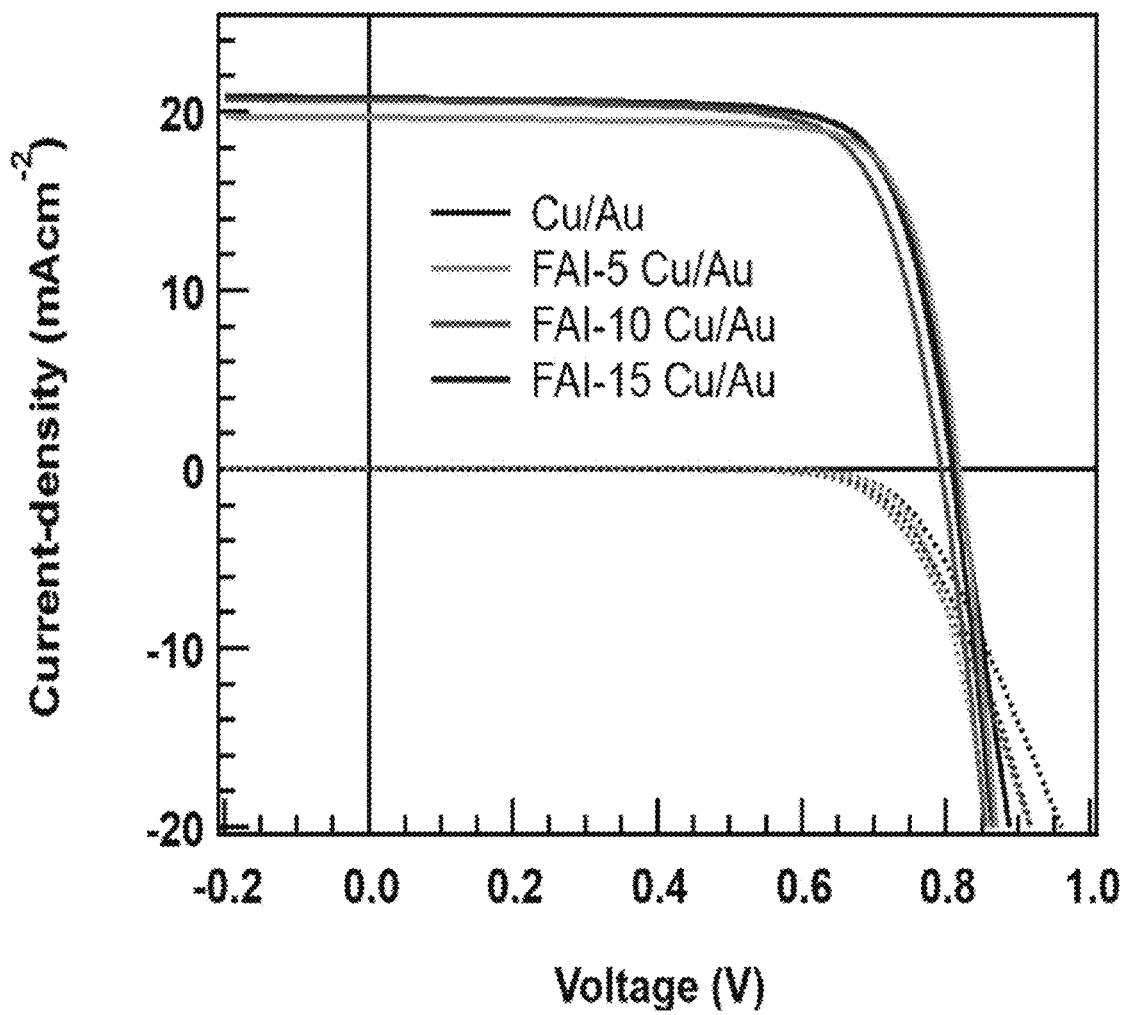
Figure 14:
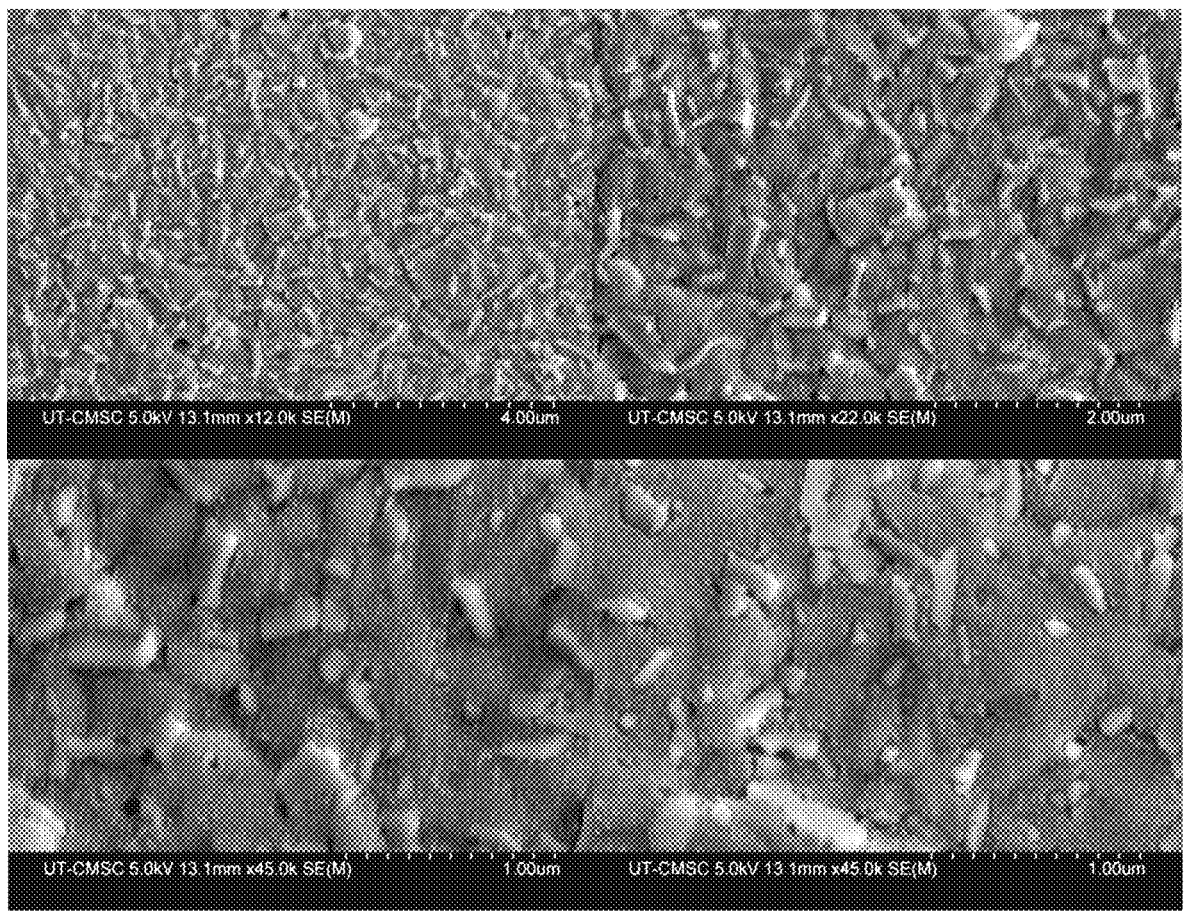
FIG. 14: SEM images of FAI-treated and annealed CdTe samples (annealed for 5 minutes at 150° C.).
Figure 15:
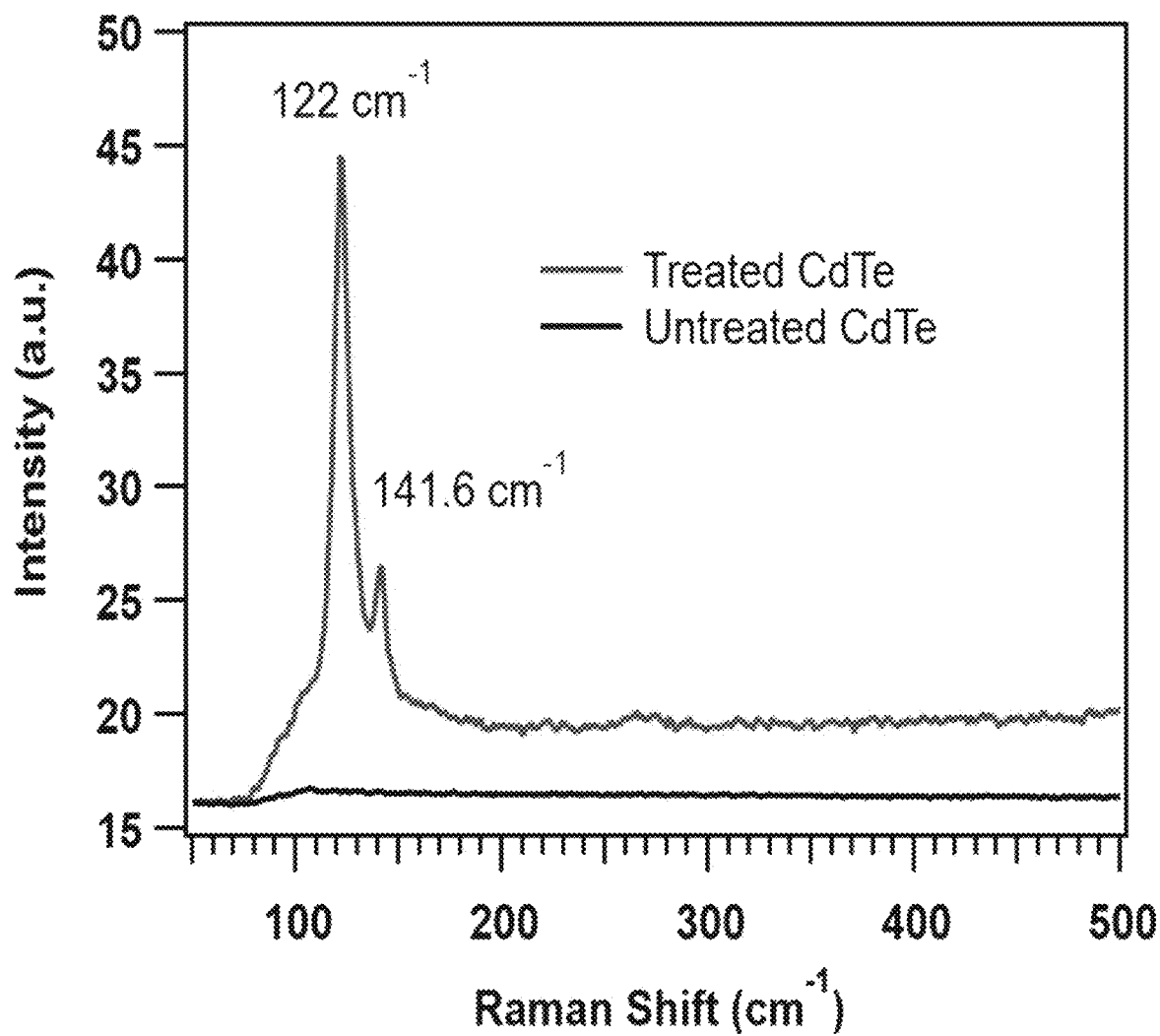
FIG. 15: Raman spectrum of FAI-treated CdTe samples (annealed for 5 minutes at 150° C.).

CdTe samples were treated as described above in Example II, only with FAI instead of MAI. The samples were FAI-treated and then annealed for 5 minutes at 150° C. in an ambient environment. FIG. 13A shows the current-density Vs voltage (J-V), and FIG. 13B shows Table 4, displaying the performance characteristics, of the FAI-treated and annealed CdTe samples. FIG. 14 shows SEM images of the FAI-treated and annealed CdTe samples. FIG. 15 shows a Raman spectrum of an FAI-treated and annealed CdTe sample. As seen from FIGS. 13-15, FAI successfully treated the CdTe to create a Te-rich surface, similar to MAI.

Example IV

Figure 16:
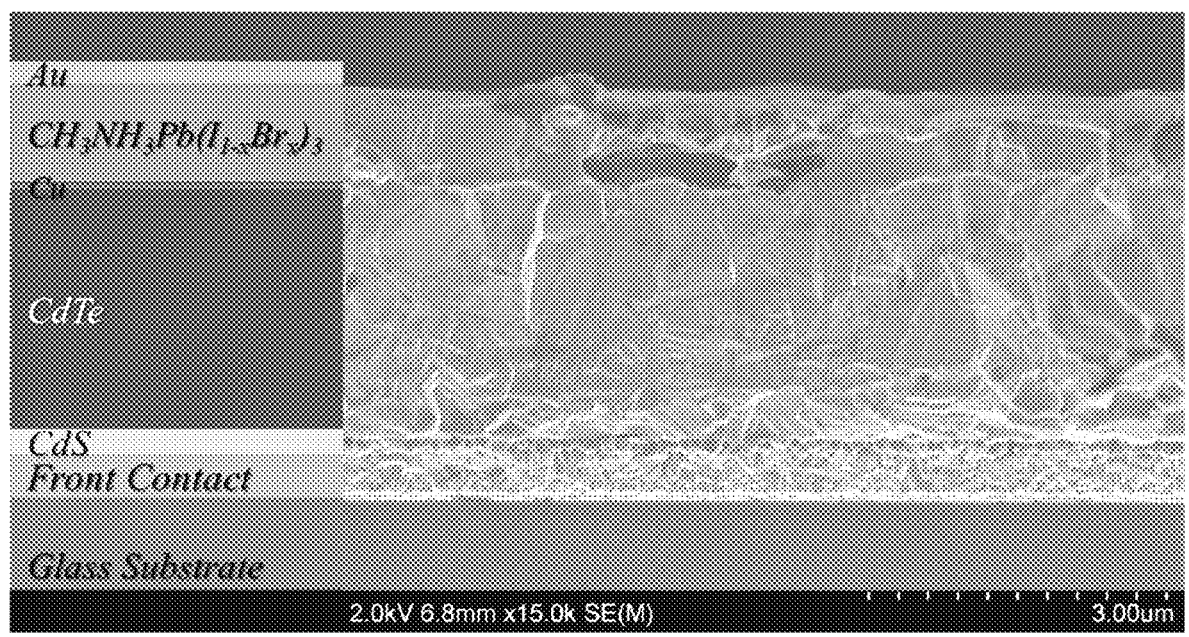
FIG. 16: Cross-sectional SEM image of photovoltaic devices having a MAPb(I$_{1-x}$Br$_x$)$_3$ hole transport layer, where x is from 0.1 to 0.9.
Figure 17:
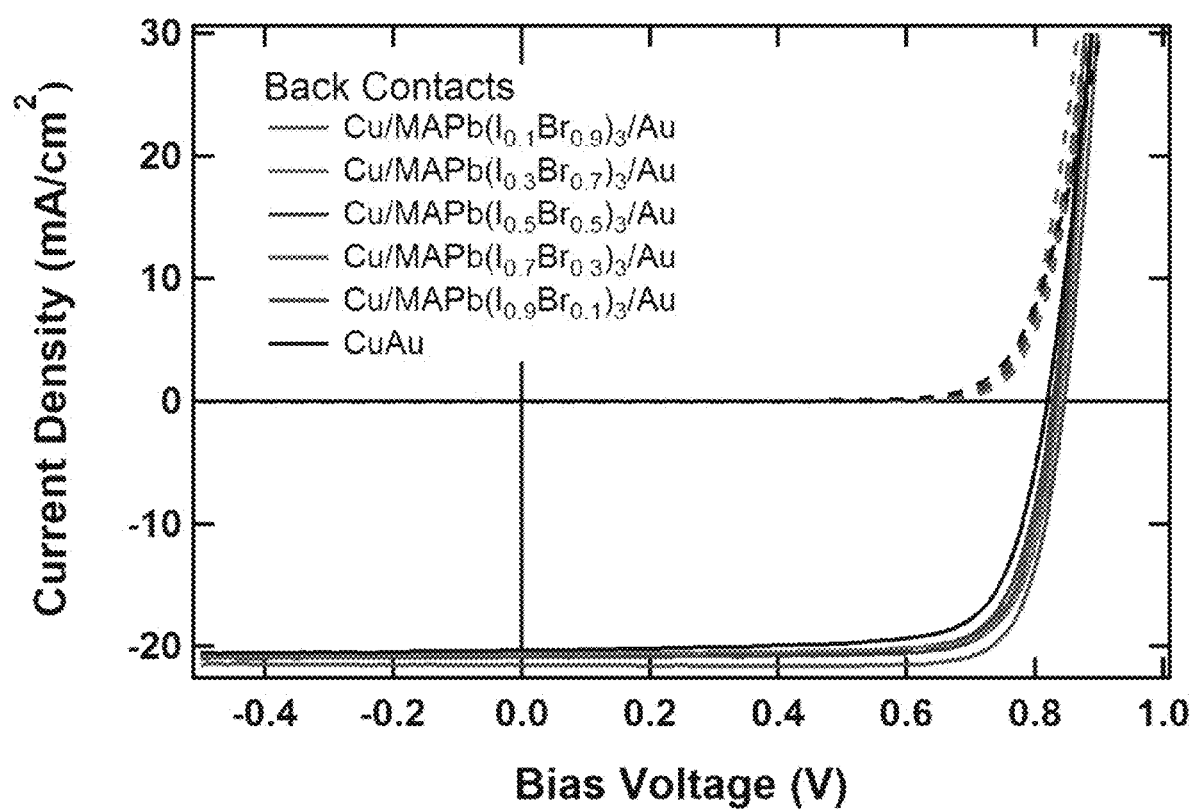
FIG. 17: Graph of current density versus bias voltage for photovoltaic devices having a MAPb(I$_{1-x}$Br$_x$)$_3$ hole transport layer, where x varies from 0.1 to 0.9.

Perovskite hole transport layers of varying composition were inserted into CdS/CdTe cells, and the bandgap of the perovskite hole transport layers was tuned by composition. FIG. 16 shows a cross-section SEM image of the CdS/CdTe/Cu/MAPb(I$_{1-x}$Br$_x$)$_3$/Au structure with the different layers illustrated. As seen in FIG. 16, the structures included a layer of Cu on the CdTe, then the perovskite layer on the layer of Cu, and an Au back contact on the perovskite layer. The perovskite layer was a MAPb(I$_{1-x}$Br$_x$)$_3$ material, where x was varied between different samples. Samples were made where x was 0.1, 0.3, 0.5, 0.7, and 0.9. As the amount of Br is increased, the bandgap of the material is increased. A control sample was made with no perovskite layer. FIG. 17 shows a graph of bias voltage for the different structures.

FIG. 18 shows Table 5, displaying the performance parameters of the different structures. As seen from FIG. 18, a high fill factor of 80.7% was achieved with the Br90% structure (i.e., MAPb(I$_{0.1}$Br$_{0.9}$)$_3$).

Figure 19:
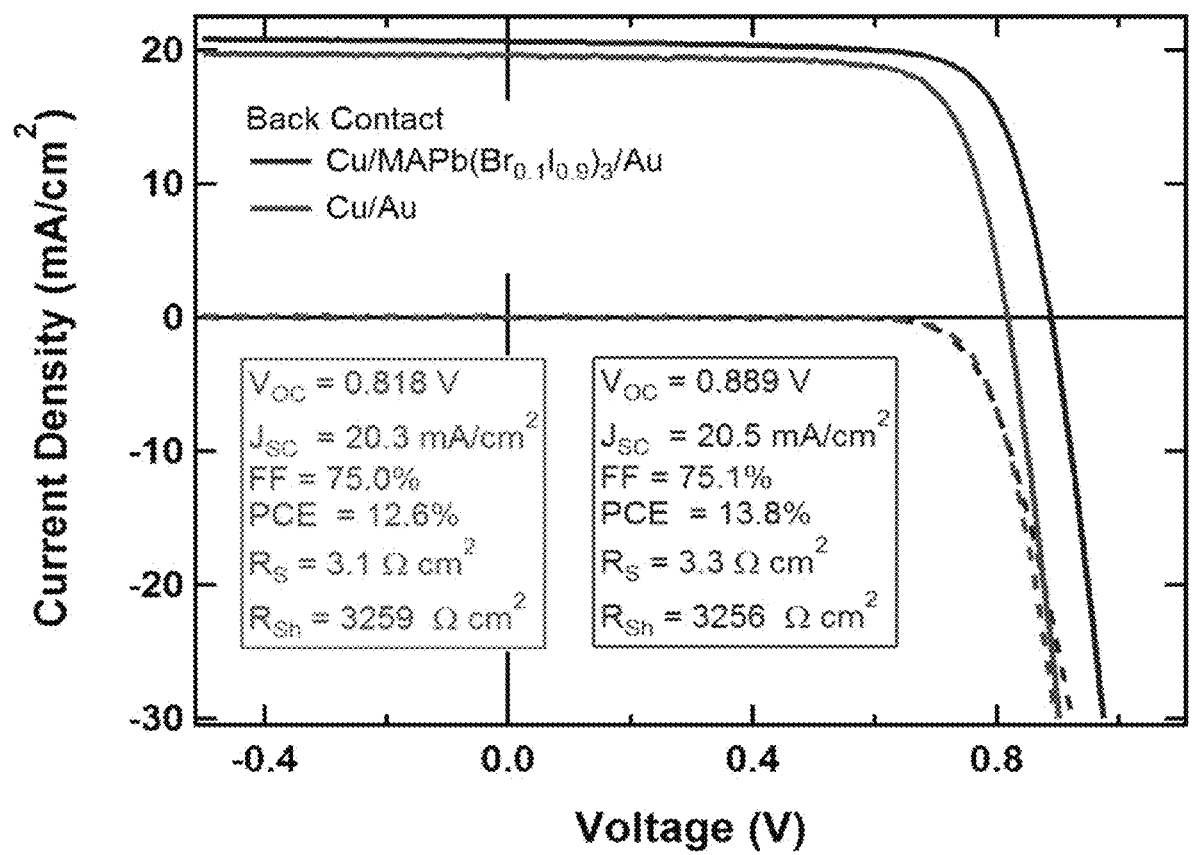
FIG. 19: Graph showing J-V characteristics of photovoltaic devices having a Cu/MAPb(Br$_{0.1}$I$_{0.9}$)$_3$/Au or a Cu/Au back contact.
Figure 20:
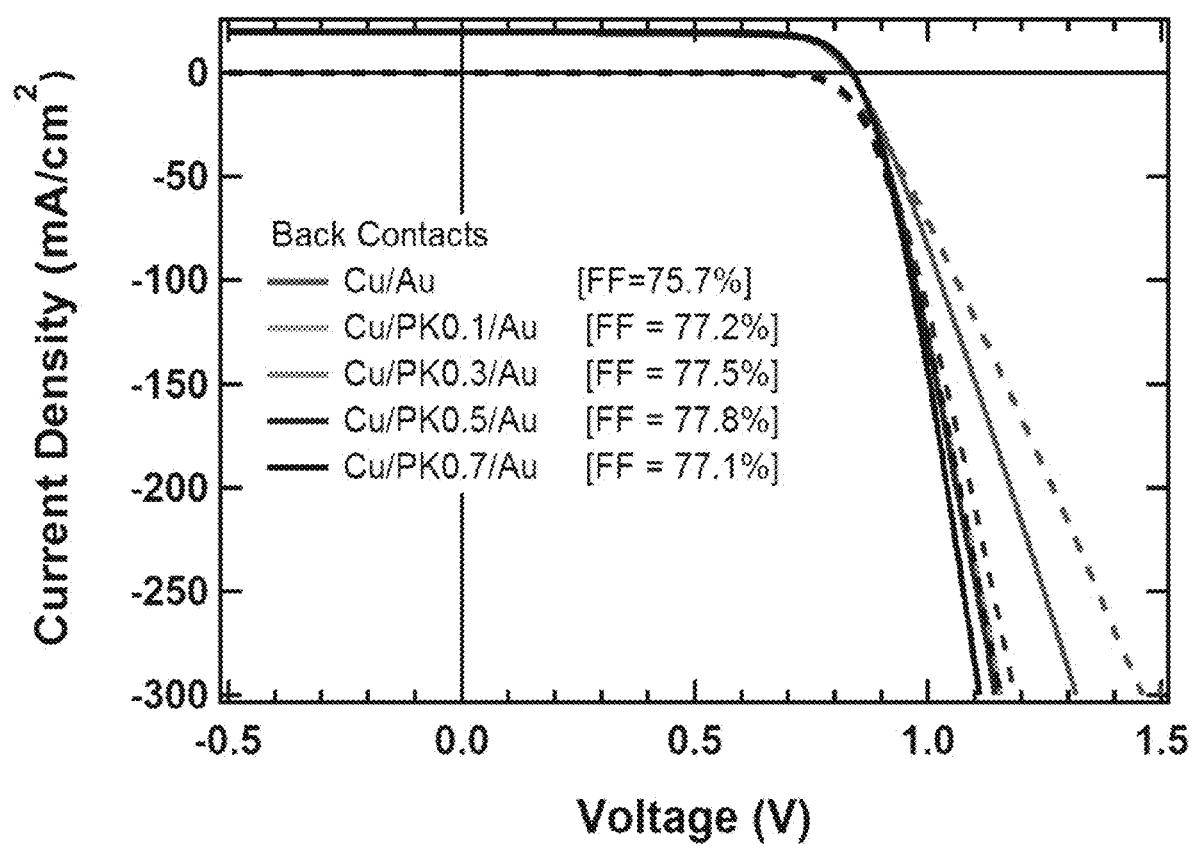
FIG. 20: Graph showing J-V characteristics of photovoltaic devices having back contacts of Cu/Au, Cu/PK$_{0.1}$/Au, Cu/PK$_{0.3}$/Au, Cu/PK$_{0.5}$/Au, or Cu/PK$_{0.7}$/Au, where PK is a perovskite.

Photovoltaic devices having CdS/CdTe/MAPb(Br$_{0.1}$I$_{0.9}$)$_3$/Au structures were made. FIGS. 19-20 show graphs of current density versus voltage for these structures. $V_{OC}$ improvement was observed with the application of the perovskite layer with respect to a standard back contact. One coupon (~20 cells) showed several cells with a $V_{OC}$ greater than 870 mV. FF improvement was observed with the addition of the perovskite layer. Improvement in cross-over effect can be seen with the perovskite HTL. $R_s$ in far forward bias decreases with bandgap.

Figure 21A:
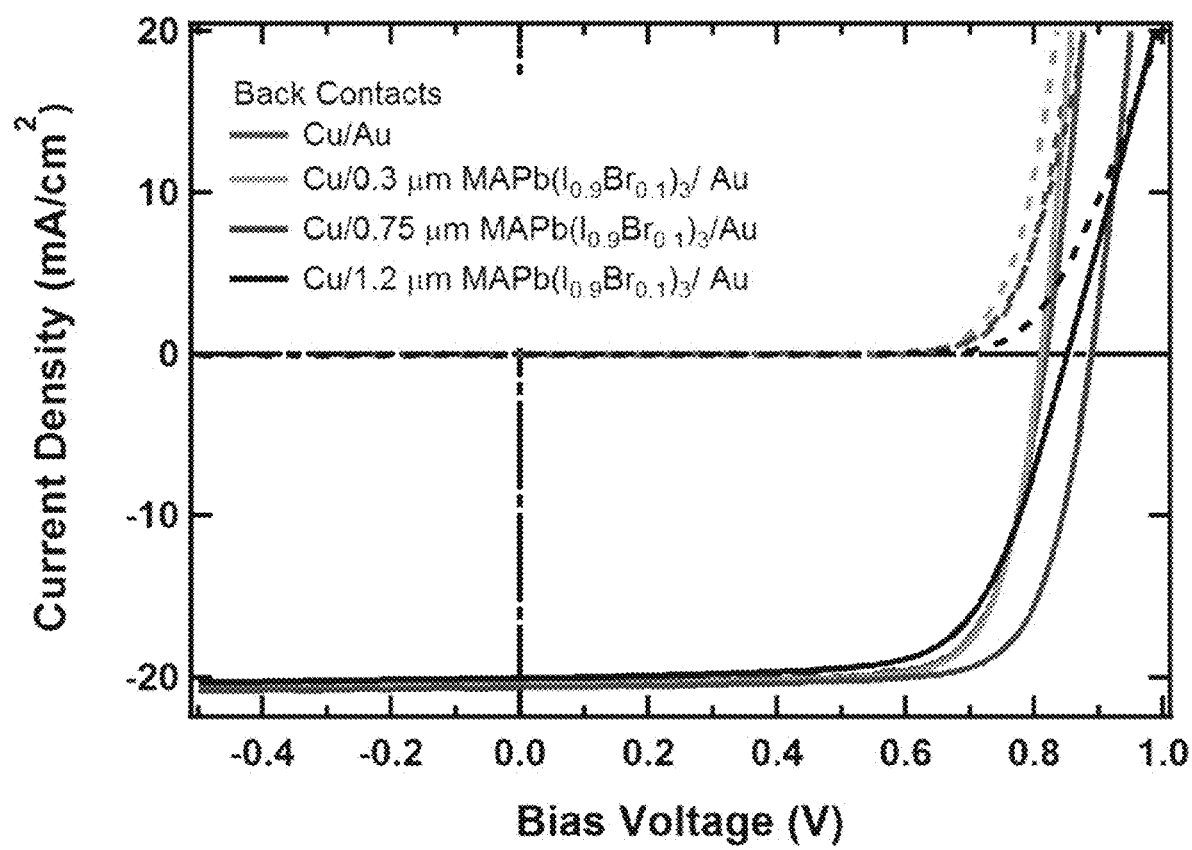

FIGS. 21A-21B show J-V characteristics for Cu/Au and Cu/MAPb(I$_{0.9}$Br$_{0.1}$)$_3$/Au back contact devices. J-V traces for the best devices were when bromine concentration was varied from 10% to 90% in MAPb$_{(1-x}$Br$_x)_3$. The corresponding cells' parameters are provided in FIG. 18. JV scan was made from forward to reverse bias at slow rate from 1.5 to 0.5 V at 6 V/s.

Figure 22:
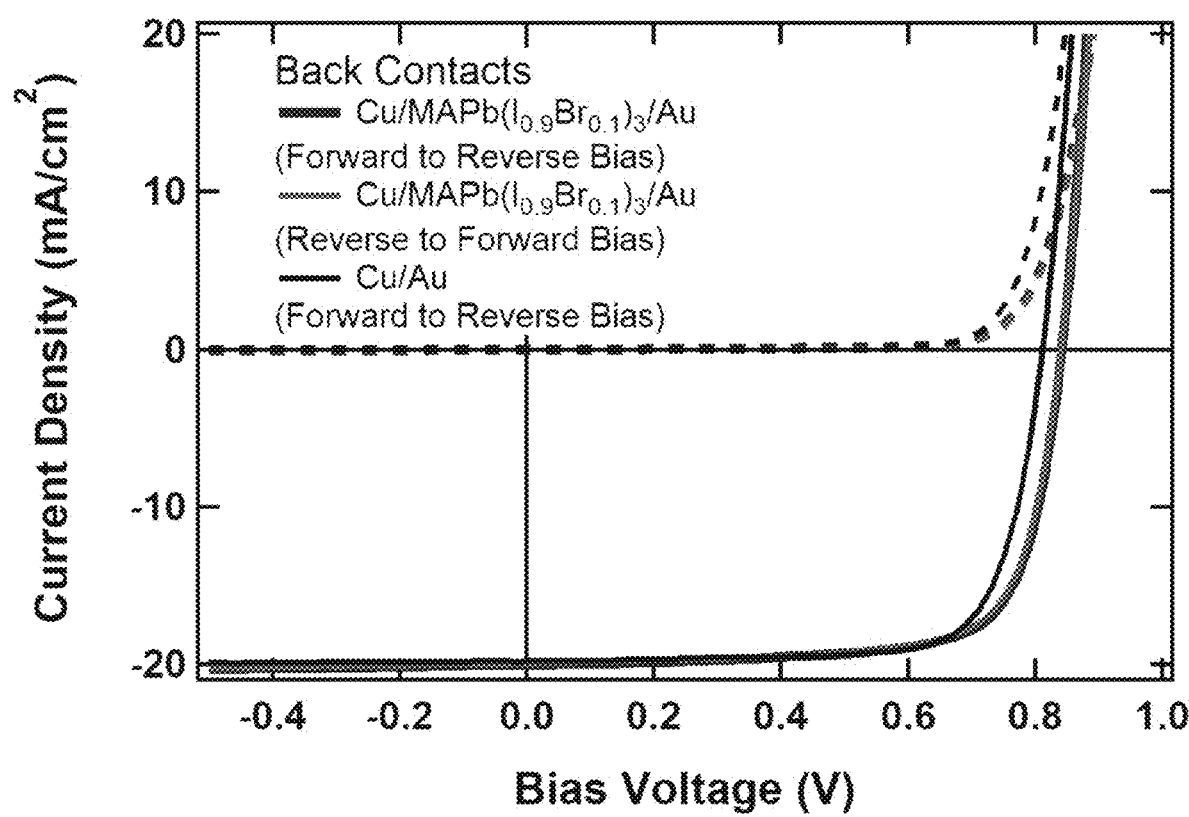
FIG. 22: J-V curve showing no significant hysteresis in perovskite HTL CdTe solar cells.
Figure 23A:
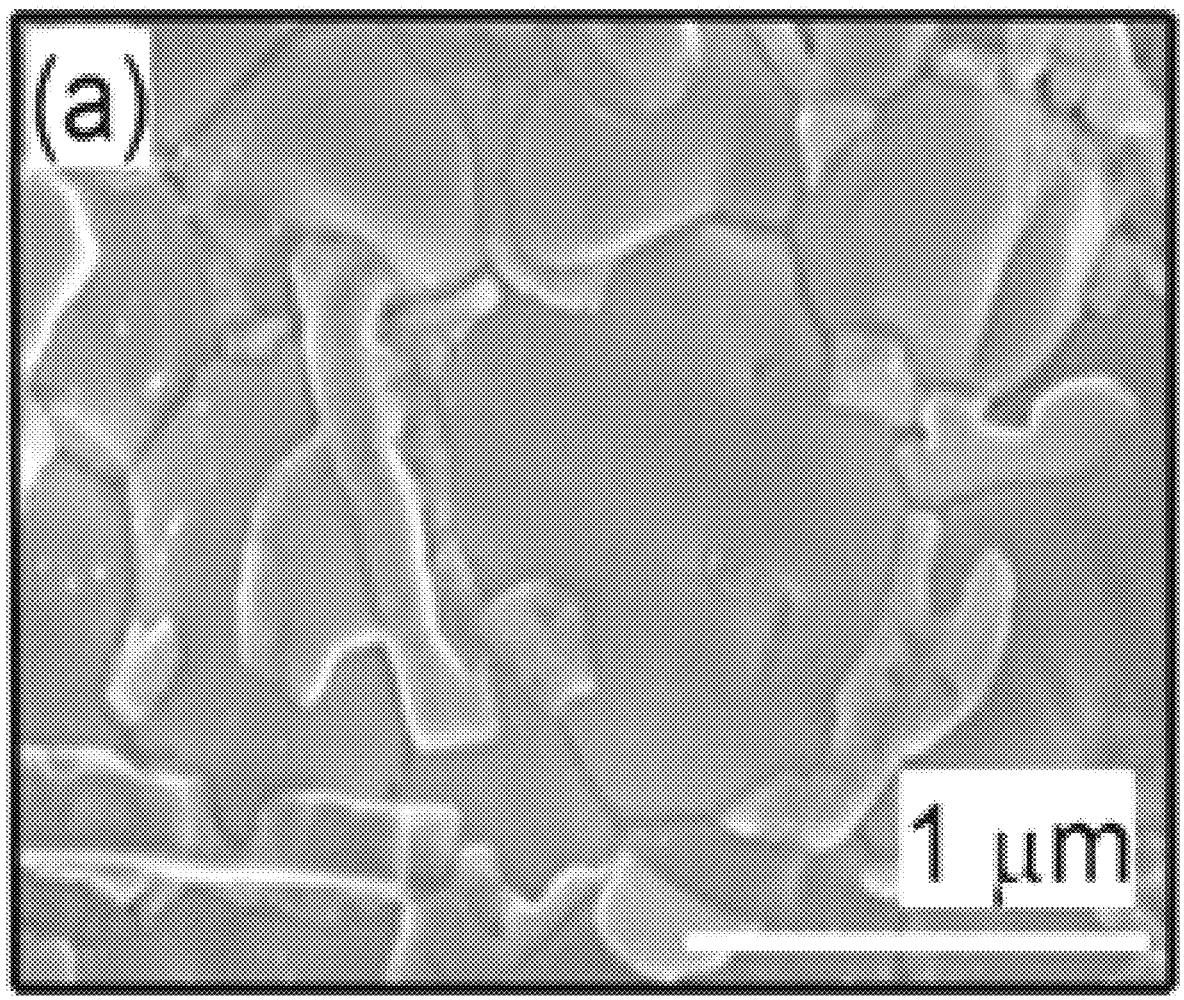
FIGS. 23A-23H: SEM images of CdCl$_2$ treated CdTe (FIG. 23A), MAI-treated CdTe (FIGS. 23B-23C), MABr-treated CdTe (FIG. 23D), MACl-treated CdTe (FIG. 23E), untreated CdTe (FIG. 23F), and CdTe with MAI rinsed prior to heating MAI-treated (FIG. 23G) and untreated (FIG. 23H) CdTe with Cu/Au contact.
Figure 23B:
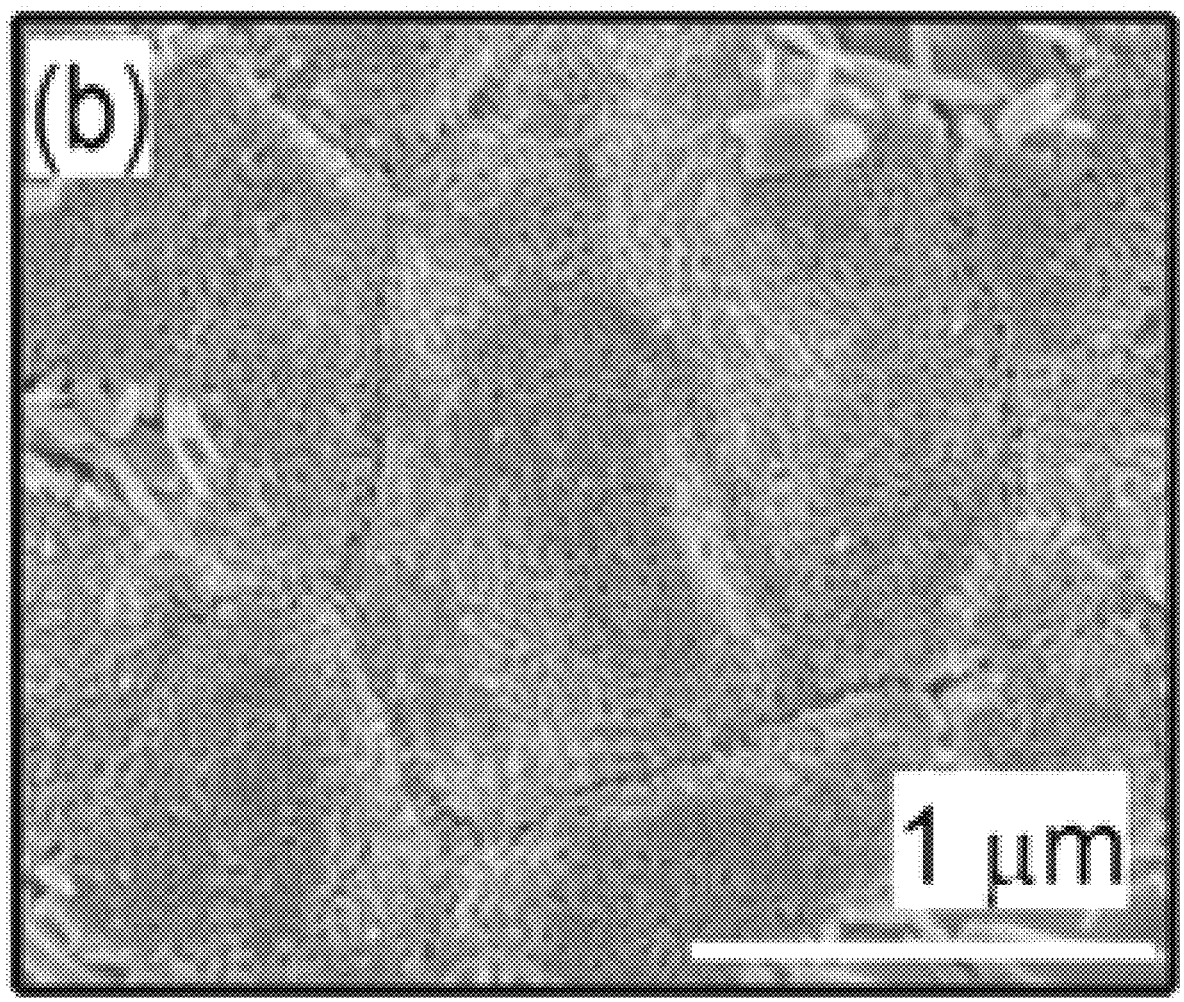
Figure 23C:
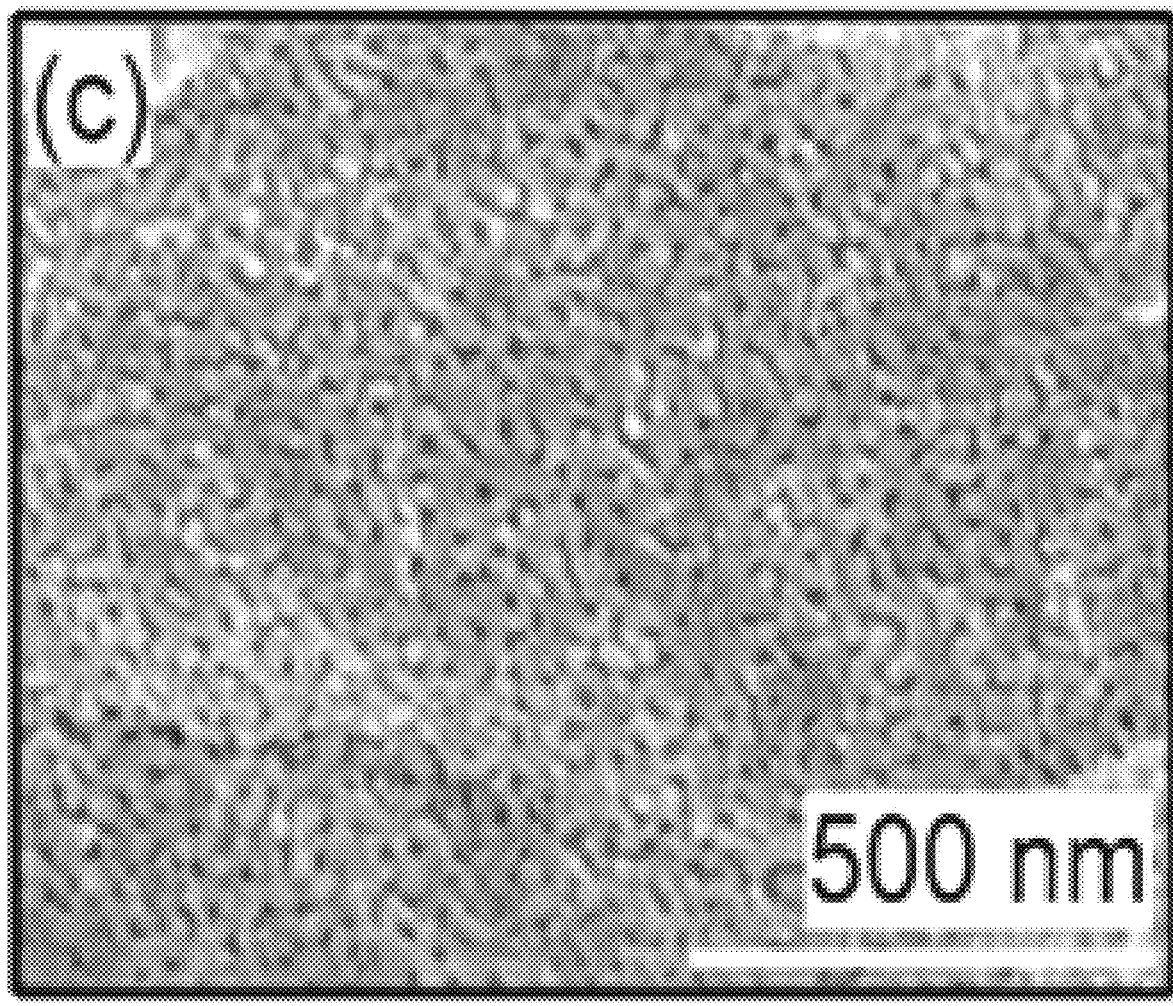
Figure 23D:
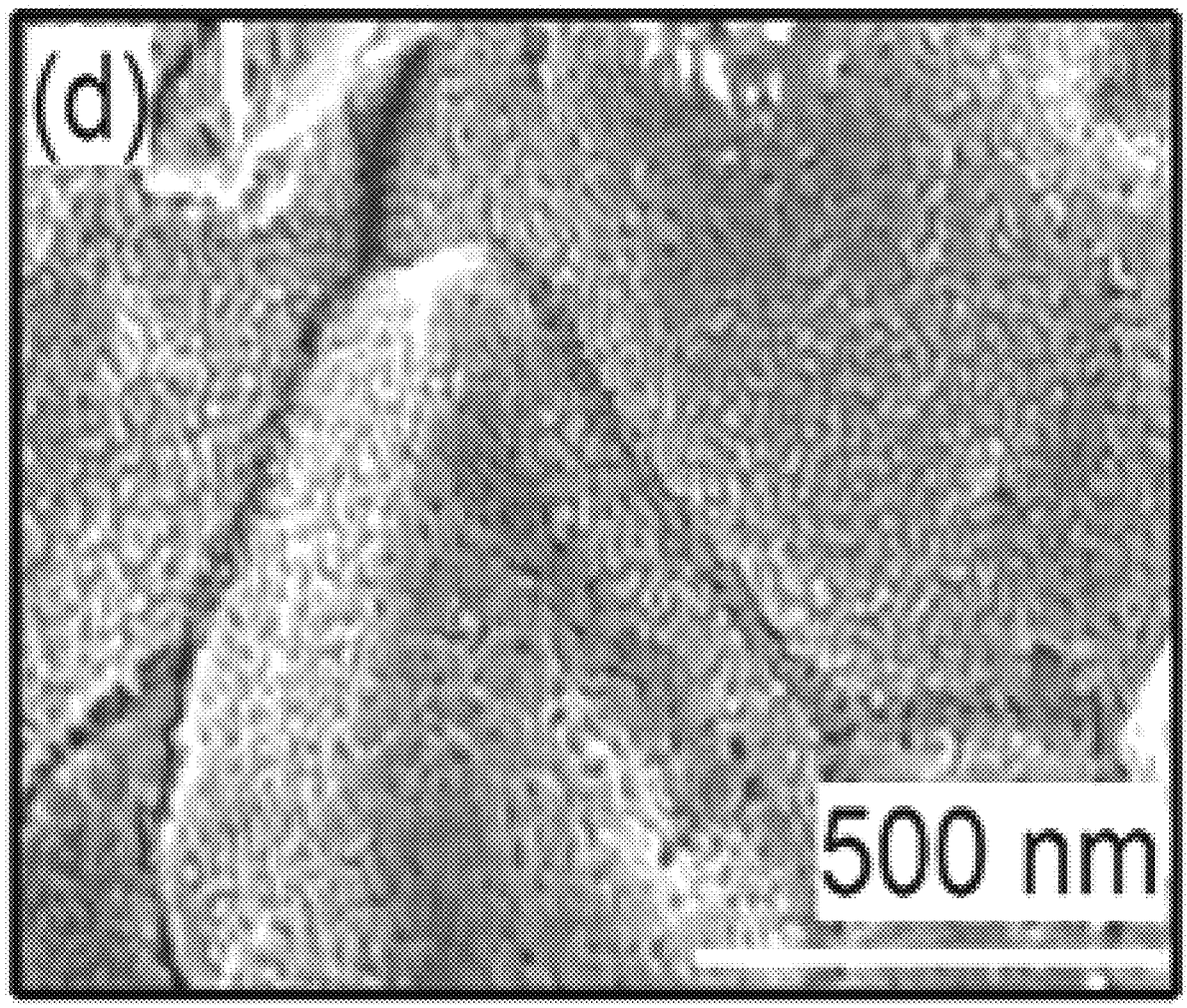
Figure 23E:
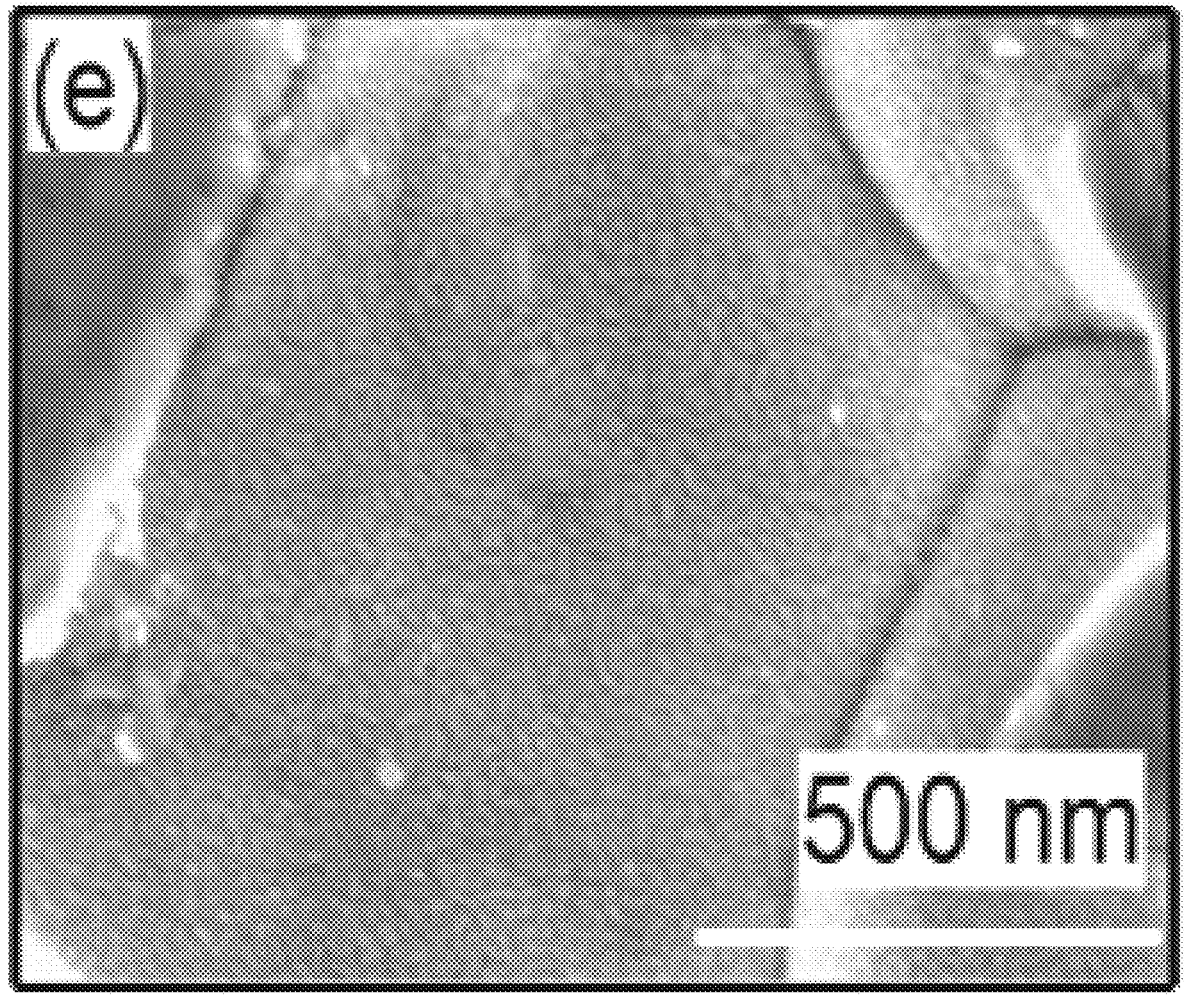
Figure 23F:
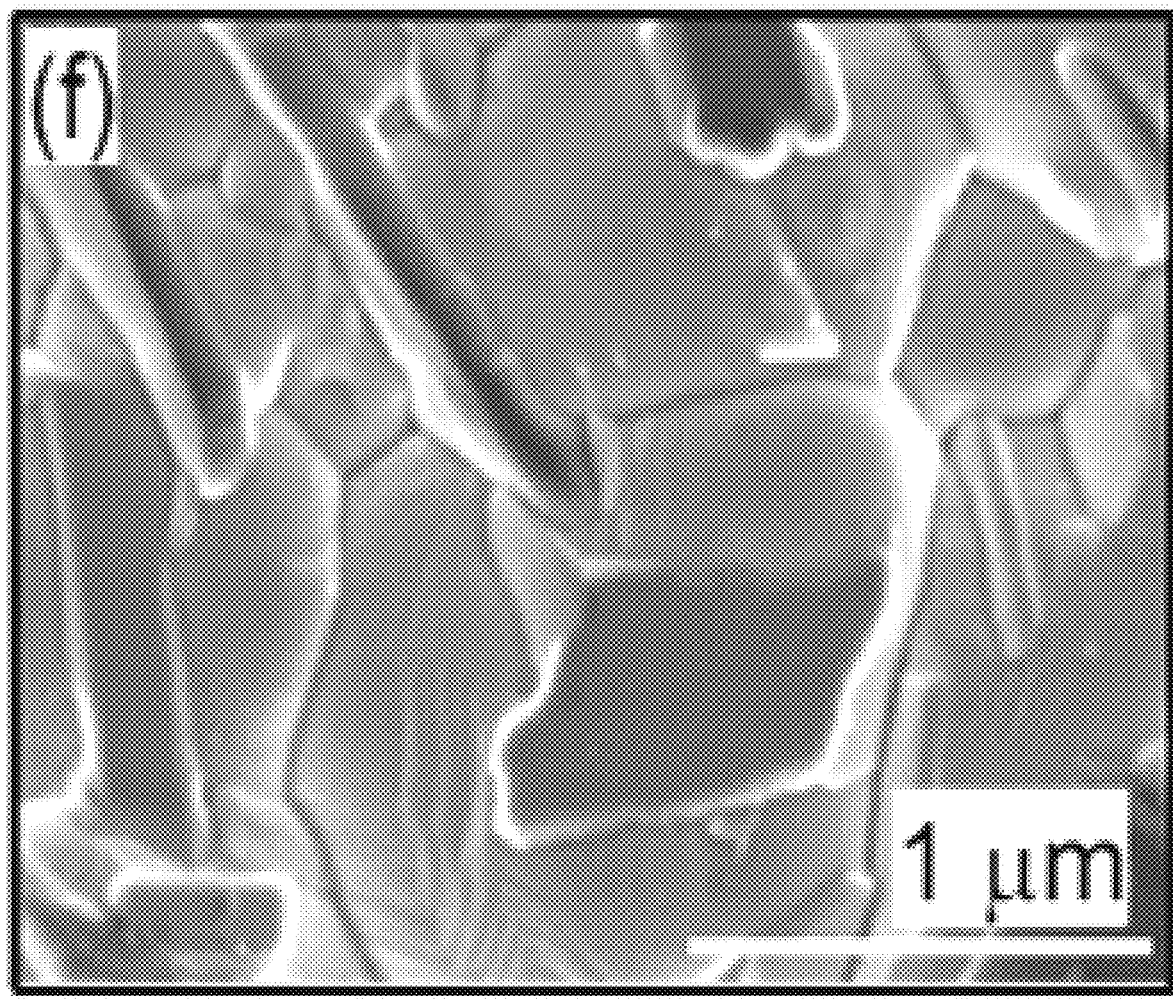
Figure 23G:
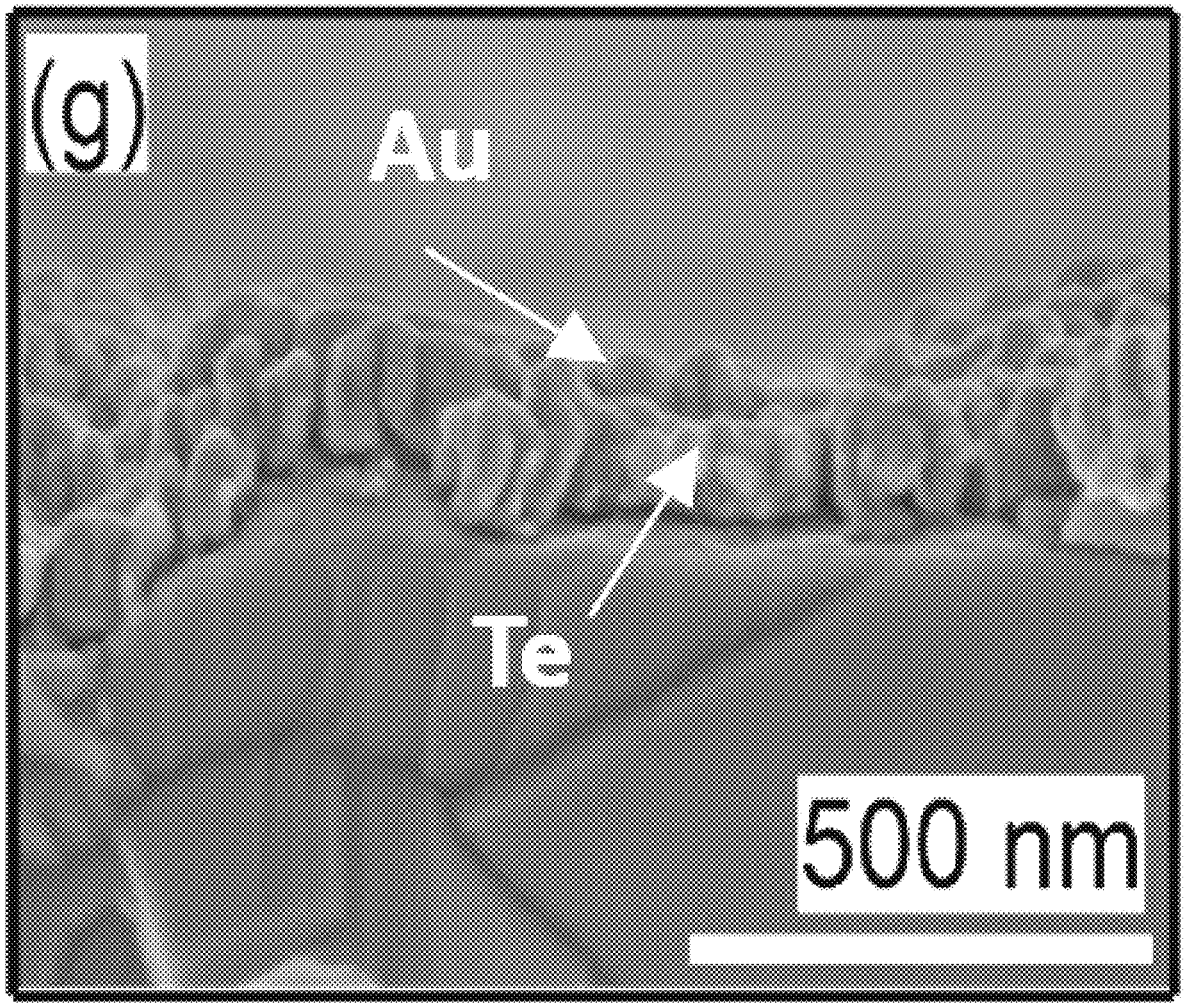
Figure 23H:
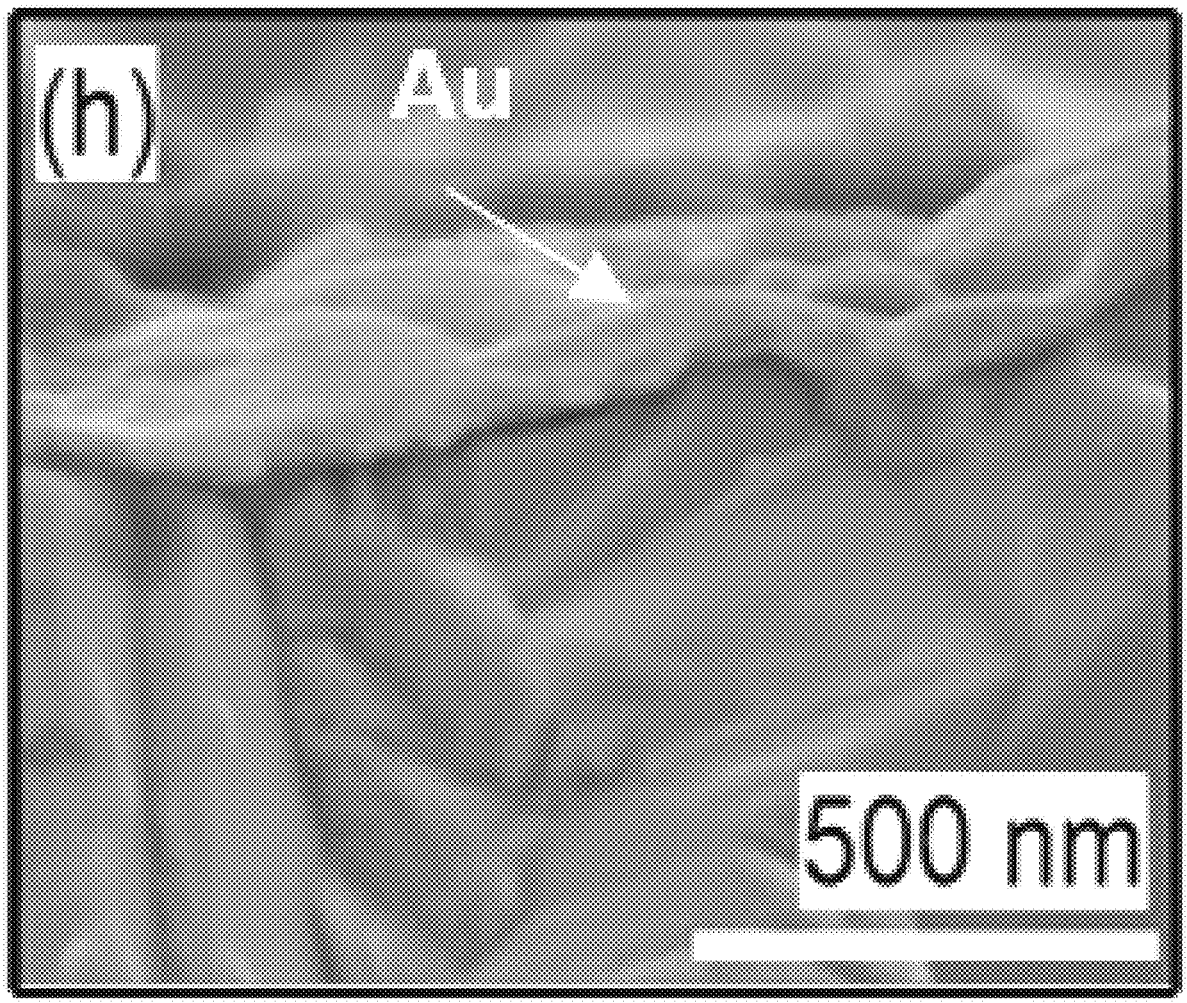

Hysteresis was measured in J-V for perovskite back-contacted cells. Perovskite solar cells display anomalous J-V hysteresis phenomenon with the possible reasons of ferro-electricity, ion migration, and unbalance charge collection rates. For the J-V measurement tests, CdTe solar cells with Cu/Au and Cu/MAPb$_3$I/Au scanned forward and reverse at 6 V/s. Significant hysteresis was not observed in perovskite HTL CdTe solar cells. (FIG. 22.)

Example V

Figure 24:
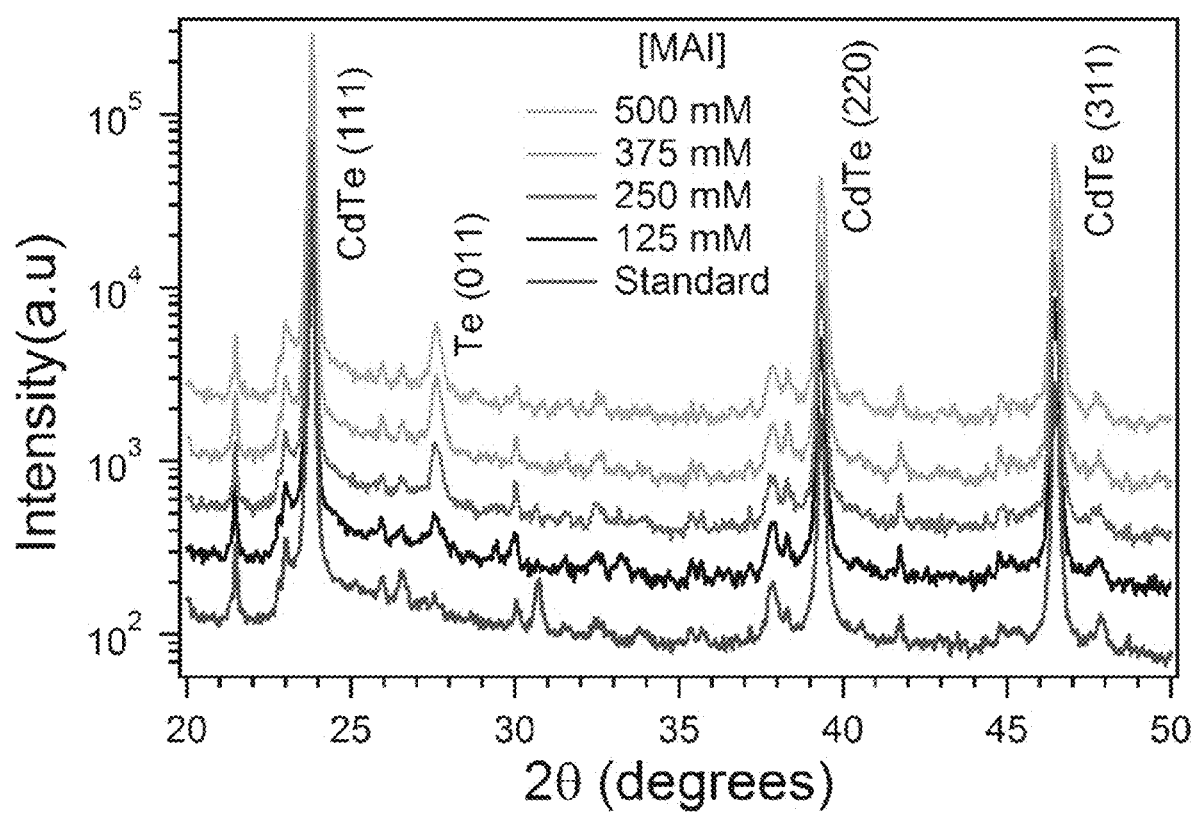
FIG. 24: XRD patterns of CdTe following treatment by 500 mM MAI, 375 mM MAI, 250 mM MAI, 125 mM MAI, or no treatment.
Figure 25:
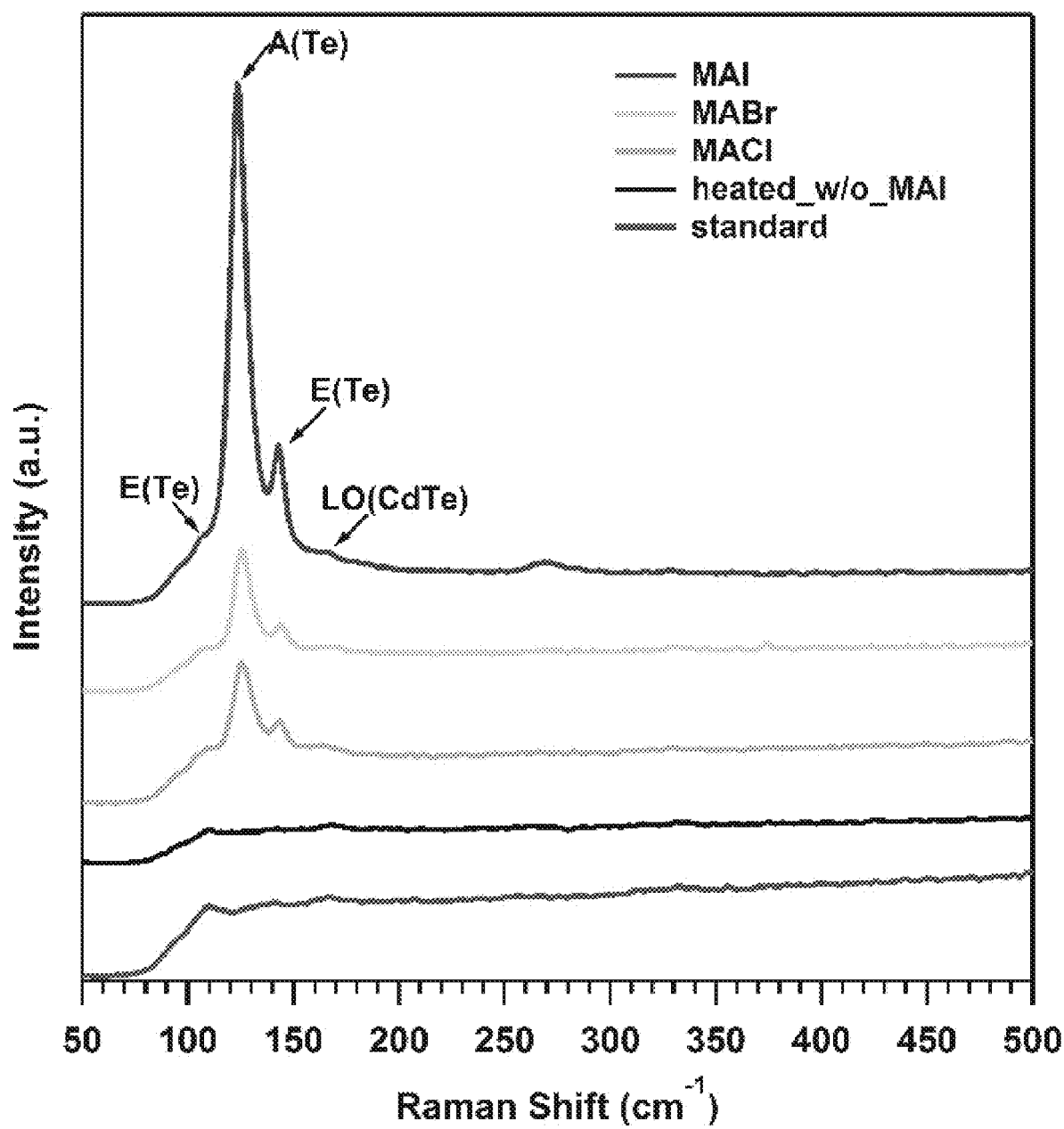
FIG. 25: Raman spectra of CdTe following treatment with MAI, MABr, or MACl, heated with no treatment, or no treatment.

CdTe was treated with varying concentrations of MAI, and it was observed that MAI treatment of CdTe forms a Te layer. FIGS. 23A-23H show SEM images of CdCl$_2$-treated CdTe, MAI-treated CdTe, MABr-treated CdTe, and MACl-treated CdTe, and untreated CdTe. FIG. 24 shows XRD patterns of the CdTe following treatment by 500 mM MAI, 375 mM MAI, 250 mM MAI, 125 mM MAI, or no treatment. As seen in FIG. 24, a peak corresponding to Te has a greater intensity following treatment with any MAI compared to no treatment. FIG. 25 shows Raman spectra of CdTe following treatment with MAI, MABr, or MACl, heated with no treatment, or no treatment. As seen in FIG. 25, peaks corresponding to Te appear following treatment with MAI, MABr, or MACl, but not following heating without such treatment, and not without any treatment.

FIGS. 26-27 illustrate the process used for treatment with MAI, MABr, or MACl. In step (a) in FIG. 26, a MAI thin film is prepared on the CdTe surface. In step (b) in FIG. 26, the MAI thin film is reacted with the CdTe surface. Cadmium perovskites form by complexation in the MAI thin film layer. In step (c) in FIG. 26, excess MAI and Cd-based perovskites (MA$_2$CdI$_4$ perovskite) are removed by IPA. The result, depicted in step (d) in FIG. 26, is an elemental Te layer formed on the CdTe surface. Without wishing to be bound by theory, it is believed that the cadmium perovskites and elemental Te form according to the following chemical equation:

$$MAI(s) + CdTe(s) \xrightarrow{\Delta} MA_2CdI_4(s) + Te(s)$$

The process by which this happens is further illustrated in FIGS. 27A-27B. FIG. 27A depicts extracting Cd from the CdTe surface by forming MA$_2$CdI$_4$, and FIG. 27B depicts removing MA$_2$CdI$_4$ and excess MAI.

Figure 28A:
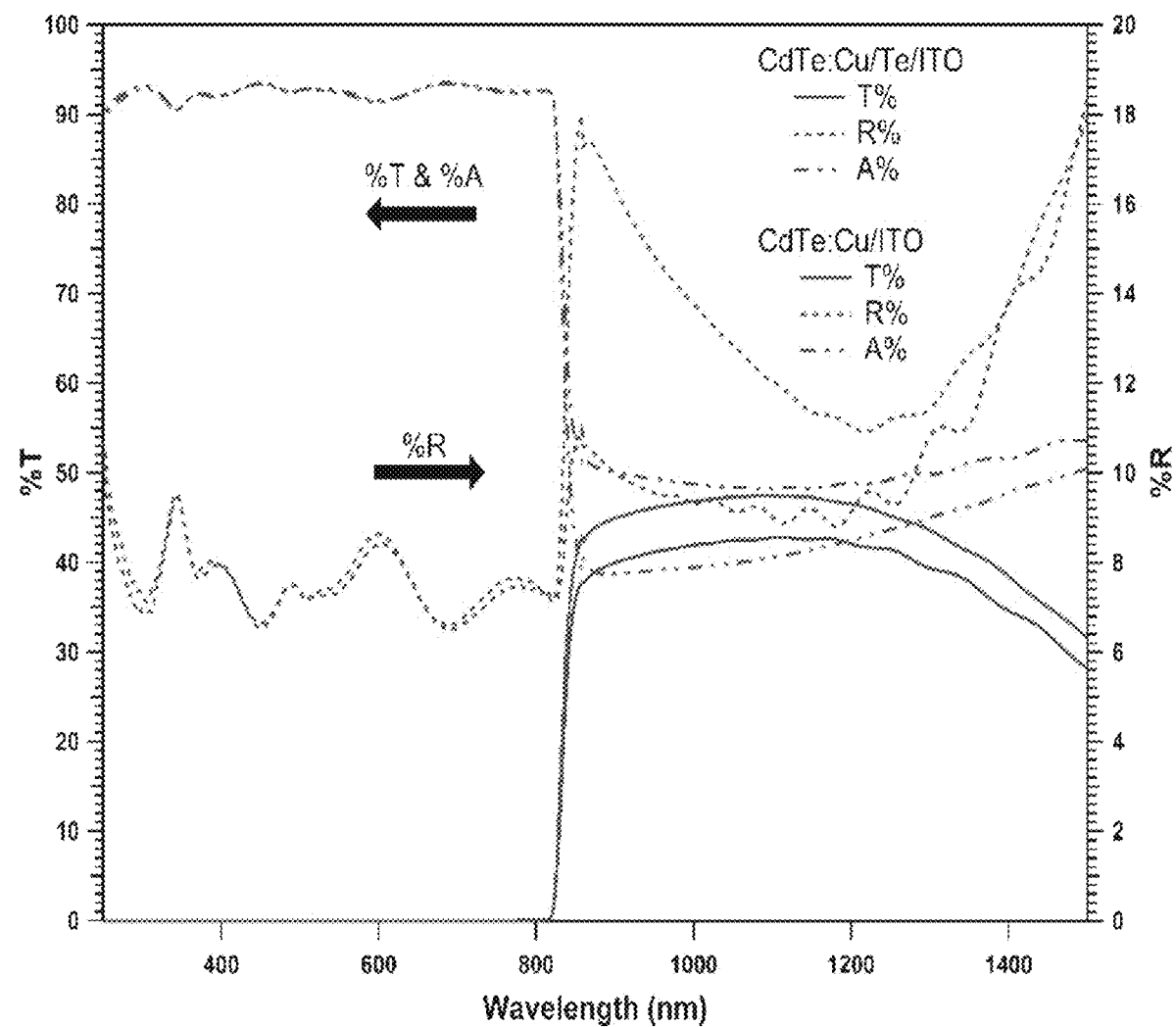
FIGS. 28A-28B: Graph of % T and % R as a function of wavelength (FIG. 28A), Table 7, showing performance characteristics (FIG. 28B), and graph of J-V characteristics (FIG. 28C), for devices made with or without MAI treatment followed by either a Au back contact or an ITO back contact.
Figure 28C:
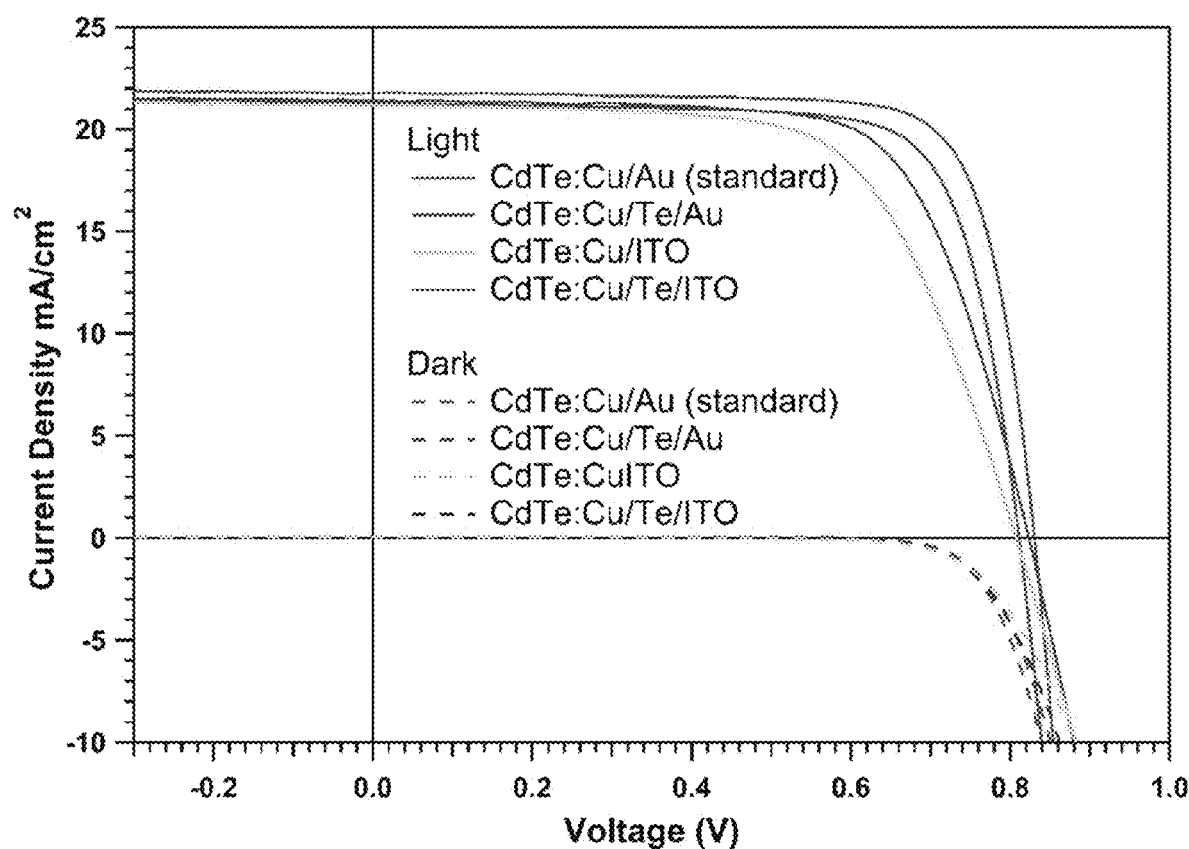

Photovoltaic devices were made with or without an MAI CdTe treatment followed by fabrication of either an Au back contact or an ITO back contact. 2 nm of Cu (optimized for Au metallization) was diffused into the CdTe. For the ITO back contact, 125 nm of ITO was sputtered from a 3" target at room temperature. FIG. 28A shows a graph of % T and % R as a function of wavelength for these devices, FIG. 28B shows a table of performance characteristics, and FIG. 28C shows J-V characteristics, for these devices. The $V_{OC}$ was higher for MAI-treated devices, but the FF values were lower due to the ITO (~35 Ω/sq.). The ITO back contact on the MAI-treated CdTe showed the lowest back barrier height. The transmittance reduction due to MAI treatment in the NIR region was ~6%.

While the devices, layer stacks, and methods have been described with reference to various embodiments, it should be understood by those skilled in the art that various changes may be made and equivalents may be substituted for elements thereof without departing from the essential scope of the invention. In addition, many modifications may be made to adapt a particular situation or material to the teachings of the invention without departing from the essential scope thereof. Therefore, it is intended that the invention not be limited to the particular embodiment disclosed herein contemplated for carrying out this invention, but that the invention will include all embodiments falling within the scope of the claims.

What is claimed is:

1. An optoelectronic device comprising:
   a front electrode comprising a transparent conductive oxide;
   a photovoltaic heterojunction on the front electrode, wherein the photovoltaic heterojunction comprises a semiconductor absorber layer comprising CdTe on a semiconductor window layer comprising CdS;
   a back electrode comprising gold on the semiconductor absorber layer;
   a hole transport layer disposed between the semiconductor absorber layer and the back electrode, wherein the hole transport layer comprises a perovskite, wherein the perovskite comprises $MAPbBr_xI_{3-x}$, wherein MA is methylammonium and x ranges from 0.1 to 0.9; and
   copper disposed on the semiconductor absorber layer and between the semiconductor absorber layer and the hole transport layer.

2. The optoelectronic device of claim 1, wherein x is selected from the group consisting of 0.1, 0.3, 0.5, 0.7, and 0.9.

3. The optoelectronic device of claim 1, wherein the copper is directly on the semiconductor absorber layer, and wherein the hole transport layer is directly on the copper.

4. A layer stack comprising:
   a support;
   a front contact layer on the support;
   a photovoltaic heterojunction on the front contact layer, wherein the photovoltaic heterojunction comprises a semiconductor window layer and a CdTe layer, wherein the CdTe layer has a Te-rich surface; and
   complexes of a cadmium perovskite in solution directly on the Te-rich surface of the CdTe layer,
   wherein the solution further comprises an organic halide in a solvent,
   wherein the cadmium perovskite comprises $MA_2CdX_4$, and the organic halide has a formula of MAX, wherein MA is methylammonium and X is selected from the group consisting of I, Br, Cl, and F.

* * * * *